(12) United States Patent
Fan et al.

(10) Patent No.: US 12,207,485 B2
(45) Date of Patent: Jan. 21, 2025

(54) DISPLAY PANEL AND DISPLAY DEVICE

(71) Applicant: Hubei Yangtze Industrial Innovation Center of Advanced Display Co., Ltd., Wuhan (CN)

(72) Inventors: Xuelin Fan, Wuhan (CN); Yang Zeng, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 238 days.

(21) Appl. No.: 17/131,412

(22) Filed: Dec. 22, 2020

(65) Prior Publication Data

US 2021/0151702 A1 May 20, 2021

(30) Foreign Application Priority Data

Sep. 29, 2020 (CN) .......................... 202011051459.6

(51) Int. Cl.
*H10K 50/115* (2023.01)
*H10K 50/856* (2023.01)

(52) U.S. Cl.
CPC ......... *H10K 50/115* (2023.02); *H10K 50/856* (2023.02)

(58) Field of Classification Search
CPC ............... H01L 27/322; H01L 27/3246; H01L 27/3283; H01L 25/0753; H01L 51/5284; H01L 51/5281; H01L 33/504; H01L 51/5271; H01L 2933/0033; H01L 2933/005; H01L 2933/0058; H01L 33/52; H01L 33/58; H01L 33/48; H01L 33/50; H01L 33/501; H01L 33/502; H01L 2933/0041; H10K 50/856; H10K 50/865; H10K 59/8792; H10K 59/878;
(Continued)

(56) References Cited

U.S. PATENT DOCUMENTS 5,742,129 A * 4/1998 Nagayama ............. H05B 33/26
315/169.3
6,743,069 B2 * 6/2004 Palanisamy .......... H10K 50/841
257/667
(Continued)

OTHER PUBLICATIONS

Chinese Office Action dated Apr. 21, 2022 for corresponding CN Application No. 202011051459.6.

*Primary Examiner* — Sophia T Nguyen
(74) *Attorney, Agent, or Firm* — Tarolli, Sundheim, Covell & Tummino LLP

(57) ABSTRACT

The present disclosure provides a display panel and a display device including the display device. The display panel includes: a first substrate including a plurality of light-emitting units, a second substrate opposed to the first substrate and including a plurality of color changing layers having different colors; and a first barrier and a second barrier arranged between the first substrate and the second substrate. The plurality of color changing layers one-to-one correspond to the plurality of light-emitting units; the first barrier overlaps the second barrier in a thickness direction of the display panel; and an optical density of the first barrier is different from an optical density of the second barrier, and a reflectivity of the first barrier is different from a reflectivity of the second barrier.

17 Claims, 8 Drawing Sheets

(58) Field of Classification Search
CPC .. H10K 59/122; H10K 50/8426; H10K 59/35; H10K 59/353; H10K 59/38; H10K 59/8723; H10K 59/871; H10K 59/8722; G02F 1/133512
See application file for complete search history.

(56) References Cited

U.S. PATENT DOCUMENTS

| | | | | |
|---|---|---|---|---|
| 6,821,553 | B2* | 11/2004 | Miyashita | H10K 50/8426 427/68 |
| 7,339,193 | B2* | 3/2008 | Park | H10K 50/846 257/40 |
| 8,188,509 | B2* | 5/2012 | Lee | H10K 59/8722 257/E33.059 |
| 8,253,322 | B2* | 8/2012 | Lee | H01L 51/5284 313/506 |
| 8,445,914 | B2* | 5/2013 | Shim | H01L 27/1288 349/110 |
| 8,605,377 | B2* | 12/2013 | Nakamata | G02B 5/201 359/885 |
| 8,962,405 | B2* | 2/2015 | Nakajima | H01L 29/0661 438/145 |
| 10,068,954 | B2* | 9/2018 | Kim | H10K 59/8722 |
| 10,114,258 | B2* | 10/2018 | Kim | G02F 1/1339 |
| 10,209,576 | B2* | 2/2019 | Ishikawa | G02F 1/1368 |
| 10,541,381 | B2* | 1/2020 | Park | H10K 59/876 |
| 10,627,946 | B2* | 4/2020 | Bian | G06F 3/041 |
| 10,629,771 | B2* | 4/2020 | Zhang | H01L 25/0753 |
| 10,636,850 | B2* | 4/2020 | Li | H10K 50/81 |
| 10,782,839 | B2* | 9/2020 | Zhang | G06F 3/0443 |
| 10,908,331 | B2* | 2/2021 | Feng | G02F 1/136204 |
| 11,037,914 | B2* | 6/2021 | Kim | H01L 25/167 |
| 11,121,188 | B2* | 9/2021 | Jo | H10K 59/8723 |
| 11,145,797 | B1* | 10/2021 | Torrents Abad | H01L 24/81 |
| 11,164,918 | B2* | 11/2021 | Cheng | H10K 59/80522 |
| 11,177,418 | B2* | 11/2021 | Kim | H01L 51/5281 |
| 11,239,442 | B2* | 2/2022 | Zang | H10K 50/824 |
| 11,316,126 | B2* | 4/2022 | Liu | H10K 50/8428 |
| 11,342,390 | B2* | 5/2022 | Xia | H10K 59/50 |
| 11,342,529 | B2* | 5/2022 | Hu | H10K 50/8426 |
| 11,456,338 | B2* | 9/2022 | Lee | H01L 51/5271 |
| 11,489,139 | B2* | 11/2022 | Yan | H10K 59/40 |
| 11,569,483 | B2* | 1/2023 | Sekine | H10K 59/38 |
| 11,575,106 | B2* | 2/2023 | Park | H10K 59/122 |
| 11,605,681 | B2* | 3/2023 | Lee | H10K 59/122 |
| 11,973,072 | B2* | 4/2024 | Lee | H01L 33/58 |
| 11,985,844 | B2* | 5/2024 | Sun | H10K 71/00 |
| 12,004,377 | B2* | 6/2024 | Jung | H10K 59/122 |
| 2002/0131008 | A1* | 9/2002 | Iwase | H10K 50/824 349/153 |
| 2003/0063241 | A1* | 4/2003 | Matsumoto | G02F 1/133526 349/110 |
| 2003/0076472 | A1* | 4/2003 | Hosoda | G02F 1/133512 349/158 |
| 2003/0205970 | A1* | 11/2003 | Park | H10K 59/122 313/506 |
| 2003/0210361 | A1* | 11/2003 | Kiguchi | G02F 1/1333 349/106 |
| 2004/0017151 | A1* | 1/2004 | Kim | H10K 59/127 313/504 |
| 2004/0100191 | A1* | 5/2004 | Park | H10K 59/805 313/506 |
| 2004/0180457 | A1* | 9/2004 | Birnstok | H10K 59/35 438/22 |
| 2004/0201048 | A1* | 10/2004 | Seki | H10K 59/38 438/70 |
| 2004/0201798 | A1* | 10/2004 | Yeh | G02F 1/133516 349/106 |
| 2004/0212762 | A1* | 10/2004 | Yeh | G02F 1/133512 349/110 |
| 2005/0179853 | A1* | 8/2005 | Chen | G02F 1/13394 349/155 |
| 2005/0212413 | A1* | 9/2005 | Matsuura | H10K 50/814 313/504 |
| 2006/0017383 | A1* | 1/2006 | Ishida | H01L 27/322 428/917 |
| 2006/0065960 | A1* | 3/2006 | Maruyama | H10K 50/841 257/678 |
| 2006/0105251 | A1* | 5/2006 | Hwang | G02B 5/285 430/7 |
| 2006/0267969 | A1* | 11/2006 | Doi | G02F 1/133512 345/204 |
| 2006/0268216 | A1* | 11/2006 | Song | G02F 1/133351 349/158 |
| 2007/0018150 | A1* | 1/2007 | Nakajima | H10K 71/00 257/10 |
| 2007/0075625 | A1* | 4/2007 | Yuki | H10K 50/841 313/496 |
| 2007/0176550 | A1* | 8/2007 | Kwan | H10K 50/8426 313/506 |
| 2007/0188676 | A1* | 8/2007 | Choi | G02B 26/004 349/62 |
| 2007/0205719 | A1* | 9/2007 | Kim | H10K 50/841 313/512 |
| 2007/0210706 | A1* | 9/2007 | Song | H10K 50/8428 313/506 |
| 2008/0123030 | A1* | 5/2008 | Song | G02F 1/13394 349/110 |
| 2008/0150419 | A1* | 6/2008 | Kang | H10K 50/846 313/504 |
| 2008/0239637 | A1* | 10/2008 | Sung | H10K 50/846 361/679.02 |
| 2008/0309224 | A1* | 12/2008 | Kwak | H10K 59/8792 313/504 |
| 2009/0215350 | A1* | 8/2009 | Takei | H10K 50/828 445/23 |
| 2010/0097295 | A1* | 4/2010 | Kwak | H10K 50/865 345/32 |
| 2011/0018008 | A1* | 1/2011 | Lee | H10K 50/841 257/E33.059 |
| 2011/0038070 | A1* | 2/2011 | Nakamata | G02B 5/201 359/891 |
| 2011/0108880 | A1* | 5/2011 | Yanagihara | H10K 59/122 438/26 |
| 2011/0114991 | A1* | 5/2011 | Lee | H10K 50/8426 257/E33.059 |
| 2011/0128643 | A1* | 6/2011 | Nakamata | G02B 5/223 427/539 |
| 2011/0221334 | A1* | 9/2011 | Kwon | H10K 50/8428 313/504 |
| 2011/0249339 | A1* | 10/2011 | Horie | G02F 1/133512 359/601 |
| 2011/0260955 | A1* | 10/2011 | Yoshida | H10K 59/122 345/76 |
| 2011/0291086 | A1* | 12/2011 | Nishiyama | H10K 50/17 438/46 |
| 2012/0049728 | A1* | 3/2012 | Lee | H10K 50/8426 445/25 |
| 2012/0217516 | A1* | 8/2012 | Hatano | H10K 59/122 257/E33.062 |
| 2012/0268700 | A1* | 10/2012 | Shu | G02B 5/22 349/110 |
| 2013/0048967 | A1* | 2/2013 | Nishido | H10K 71/00 257/E33.059 |
| 2013/0112955 | A1* | 5/2013 | Yamazaki | H01L 51/525 257/E33.072 |
| 2013/0237116 | A1* | 9/2013 | Lee | H05B 33/04 445/25 |
| 2013/0252352 | A1* | 9/2013 | Shim | H01L 27/1214 438/14 |
| 2014/0091294 | A1* | 4/2014 | Chen | H10K 50/841 257/40 |
| 2014/0103312 | A1* | 4/2014 | Huang | H10K 59/8722 257/40 |
| 2014/0103368 | A1* | 4/2014 | Hatano | H10K 59/122 257/88 |
| 2014/0146410 | A1* | 5/2014 | Lo | G02F 1/133512 359/891 |

(56) References Cited

U.S. PATENT DOCUMENTS

| | | | | |
|---|---|---|---|---|
| 2014/0176895 | A1* | 6/2014 | Park | G02F 1/133512 438/30 |
| 2014/0183465 | A1* | 7/2014 | Jeong | H10K 50/8426 257/40 |
| 2014/0191204 | A1* | 7/2014 | Jeong | H01L 51/5246 257/40 |
| 2014/0232970 | A1* | 8/2014 | Huh | G02F 1/133512 349/110 |
| 2014/0332763 | A1* | 11/2014 | Kim | H10K 50/854 257/40 |
| 2015/0003040 | A1* | 1/2015 | Bessho | F21V 9/40 362/84 |
| 2015/0069339 | A1* | 3/2015 | Han | H10K 50/8426 257/40 |
| 2015/0090982 | A1* | 4/2015 | Lin | H10K 59/127 257/40 |
| 2015/0108403 | A1* | 4/2015 | Kawamura | C09K 19/0403 252/299.63 |
| 2015/0130007 | A1* | 5/2015 | Kawamura | H01L 27/14687 438/70 |
| 2015/0144917 | A1* | 5/2015 | Koo | H10K 59/8722 257/40 |
| 2015/0155347 | A1* | 6/2015 | Baek | H10K 59/126 257/40 |
| 2015/0243802 | A1* | 8/2015 | Fujimoto | H01L 31/02327 257/82 |
| 2015/0243929 | A1* | 8/2015 | Jeong | H10K 50/8445 257/40 |
| 2015/0277017 | A1* | 10/2015 | Aoyagi | H10K 59/38 156/60 |
| 2015/0331161 | A1* | 11/2015 | Wang | H10K 77/10 430/7 |
| 2015/0362165 | A1* | 12/2015 | Chu | H01L 33/32 362/235 |
| 2016/0054828 | A1* | 2/2016 | Lien | G06F 3/04164 345/174 |
| 2016/0181566 | A1* | 6/2016 | Wang | H10K 59/122 257/40 |
| 2016/0233458 | A1* | 8/2016 | Shen | H10K 59/35 |
| 2016/0254476 | A1* | 9/2016 | Park | H10K 50/813 257/40 |
| 2016/0260928 | A1* | 9/2016 | Choi | H10K 50/844 |
| 2016/0284942 | A1* | 9/2016 | Gao | H10K 50/8426 |
| 2016/0357042 | A1* | 12/2016 | Yoon | G02F 1/134309 |
| 2016/0359112 | A1* | 12/2016 | Wang | H10K 59/122 |
| 2016/0363797 | A1* | 12/2016 | Kimura | G06F 3/0443 |
| 2016/0364082 | A1* | 12/2016 | Kimura | G02F 1/1338 |
| 2016/0370646 | A1* | 12/2016 | Nishiyama | G03F 7/033 |
| 2016/0372528 | A1* | 12/2016 | Kamura | H01L 51/5284 |
| 2017/0033164 | A1* | 2/2017 | Liu | H10K 85/141 |
| 2017/0038637 | A1* | 2/2017 | Takeda | G02F 1/133512 |
| 2017/0069870 | A1* | 3/2017 | Wang | H10K 50/87 |
| 2017/0133357 | A1* | 5/2017 | Kuo | H01L 25/167 |
| 2017/0153766 | A1* | 6/2017 | Kimura | G02F 1/134363 |
| 2017/0170245 | A1* | 6/2017 | Lin | H10K 59/352 |
| 2017/0179438 | A1* | 6/2017 | Xu | H01L 27/3213 |
| 2017/0194602 | A1* | 7/2017 | Cui | H10K 71/00 |
| 2017/0200774 | A1* | 7/2017 | Kim | H10K 59/12 |
| 2017/0250164 | A1* | 8/2017 | Takeya | H01L 27/124 |
| 2017/0263828 | A1* | 9/2017 | Mao | H10K 59/121 |
| 2017/0269404 | A1* | 9/2017 | Ishikawa | G02F 1/133514 |
| 2017/0287887 | A1* | 10/2017 | Takeya | H01L 25/0753 |
| 2017/0317152 | A1* | 11/2017 | Hsu | H10K 50/856 |
| 2017/0317157 | A1* | 11/2017 | Li | H10K 50/8426 |
| 2017/0338212 | A1* | 11/2017 | Kuo | H01L 25/167 |
| 2017/0358624 | A1* | 12/2017 | Takeya | H01L 33/42 |
| 2018/0074372 | A1* | 3/2018 | Takeya | G02F 1/133514 |
| 2018/0114820 | A1* | 4/2018 | Shim | H10K 59/122 |
| 2018/0226604 | A1* | 8/2018 | Gong | H10K 50/846 |
| 2018/0240853 | A1* | 8/2018 | Kim | H10K 59/8722 |
| 2018/0301665 | A1* | 10/2018 | Sakamoto | H10K 71/00 |
| 2018/0342563 | A1* | 11/2018 | You | H10K 59/122 |
| 2018/0351127 | A1* | 12/2018 | So | H10K 50/171 |
| 2018/0356688 | A1* | 12/2018 | Chen | G02F 1/133514 |
| 2019/0004351 | A1* | 1/2019 | Cao | H01L 27/1248 |
| 2019/0067391 | A1* | 2/2019 | Li | H10K 50/131 |
| 2019/0081272 | A1* | 3/2019 | Jung | H10K 50/805 |
| 2019/0094608 | A1* | 3/2019 | Wan | G02F 1/133516 |
| 2019/0096967 | A1* | 3/2019 | Li | H10K 50/805 |
| 2019/0109124 | A1* | 4/2019 | Lin | H01L 33/62 |
| 2019/0131365 | A1* | 5/2019 | Jung | H01L 27/3246 |
| 2019/0165047 | A1* | 5/2019 | Xiao | H10K 59/122 |
| 2019/0165066 | A1* | 5/2019 | Lee | H10K 59/873 |
| 2019/0173047 | A1* | 6/2019 | Sun | H10K 50/824 |
| 2019/0207164 | A1* | 7/2019 | Fang | H10K 50/856 |
| 2019/0237452 | A1* | 8/2019 | Kuo | H01L 33/502 |
| 2019/0237525 | A1* | 8/2019 | Zhao | H10K 50/805 |
| 2019/0258107 | A1* | 8/2019 | Fujii | G02F 1/133308 |
| 2019/0288049 | A1* | 9/2019 | Takeya | H01L 25/167 |
| 2019/0326548 | A1* | 10/2019 | Li | H10K 59/122 |
| 2019/0393276 | A1* | 12/2019 | Kim | H10K 59/352 |
| 2020/0013766 | A1* | 1/2020 | Kim | H01L 25/167 |
| 2020/0066803 | A1* | 2/2020 | Kim | H10K 50/854 |
| 2020/0106039 | A1* | 4/2020 | Li | H10K 50/824 |
| 2020/0119237 | A1* | 4/2020 | Kim | H01L 25/0753 |
| 2020/0133053 | A1* | 4/2020 | Yang | G02F 1/133514 |
| 2020/0136077 | A1* | 4/2020 | Lee | H10K 50/16 |
| 2020/0144557 | A1* | 5/2020 | Du | H01L 51/524 |
| 2020/0152711 | A1* | 5/2020 | Liu | H10K 50/852 |
| 2020/0194503 | A1* | 6/2020 | Jo | H10K 71/00 |
| 2020/0212113 | A1* | 7/2020 | Song | H01L 33/50 |
| 2020/0218116 | A1* | 7/2020 | Takeya | H01L 25/0753 |
| 2020/0257162 | A1* | 8/2020 | Lee | H10K 59/122 |
| 2020/0266257 | A1* | 8/2020 | Fan | H10K 59/122 |
| 2020/0303470 | A1* | 9/2020 | Hsu | H10K 50/156 |
| 2020/0313113 | A1* | 10/2020 | Zang | H10K 50/824 |
| 2020/0321550 | A1* | 10/2020 | Hu | H10K 50/828 |
| 2020/0335562 | A1* | 10/2020 | Kim | H10K 59/122 |
| 2020/0343315 | A1* | 10/2020 | Lin | H01L 27/322 |
| 2020/0348562 | A1* | 11/2020 | Shi | G02F 1/133512 |
| 2020/0358026 | A1* | 11/2020 | Li | H10K 50/8426 |
| 2020/0365786 | A1* | 11/2020 | Takeya | H01L 33/62 |
| 2020/0381484 | A1* | 12/2020 | Choe | H01L 51/5275 |
| 2020/0381599 | A1* | 12/2020 | Kuo | H01L 33/50 |
| 2020/0388651 | A1* | 12/2020 | Woo | H10K 59/122 |
| 2020/0388663 | A1* | 12/2020 | Lee | H10K 50/865 |
| 2020/0395416 | A1* | 12/2020 | Bae | H01L 27/322 |
| 2021/0005672 | A1* | 1/2021 | Lee | H01L 27/322 |
| 2021/0013455 | A1* | 1/2021 | Bae | H01L 51/5271 |
| 2021/0028327 | A1* | 1/2021 | Lin | H01L 33/0095 |
| 2021/0050394 | A1* | 2/2021 | Zhao | H10K 71/00 |
| 2021/0109617 | A1* | 4/2021 | Lin | G06F 3/0412 |
| 2021/0125549 | A1* | 4/2021 | Wang | G09G 3/32 |
| 2021/0151702 | A1* | 5/2021 | Fan | H01L 51/502 |
| 2021/0159287 | A1* | 5/2021 | Cheng | H10K 59/122 |
| 2021/0183957 | A1* | 6/2021 | Zhang | H01L 27/323 |
| 2021/0193953 | A1* | 6/2021 | Liu | H10K 71/00 |
| 2021/0202804 | A1* | 7/2021 | Sun | H01L 27/322 |
| 2021/0210570 | A1* | 7/2021 | Gao | H10K 59/122 |
| 2021/0249478 | A1* | 8/2021 | Oh | H01L 51/5284 |
| 2021/0305314 | A1* | 9/2021 | Su | H01L 25/0753 |
| 2021/0320150 | A1* | 10/2021 | Yang | H01L 27/3223 |
| 2021/0325714 | A1* | 10/2021 | Shin | G02F 1/136222 |
| 2021/0328183 | A1* | 10/2021 | Sun | H01L 51/5284 |
| 2021/0336100 | A1* | 10/2021 | Hu | H01L 25/0753 |
| 2021/0359247 | A1* | 11/2021 | Wang | H10K 50/828 |
| 2021/0359276 | A1* | 11/2021 | Inari | H01L 27/3211 |
| 2021/0367186 | A1* | 11/2021 | Zhao | H10K 59/38 |
| 2021/0376000 | A1* | 12/2021 | Jin | H01L 51/56 |
| 2021/0384274 | A1* | 12/2021 | Ahn | H10K 71/135 |
| 2021/0398959 | A1* | 12/2021 | Geng | H01L 25/167 |
| 2021/0408131 | A1* | 12/2021 | Huang | H10K 59/38 |
| 2022/0013587 | A1* | 1/2022 | Jo | H01L 27/3244 |
| 2022/0020965 | A1* | 1/2022 | Park | H01L 51/5284 |
| 2022/0037411 | A1* | 2/2022 | Zhang | B41M 7/0081 |
| 2022/0037623 | A1* | 2/2022 | Park | H01L 25/0753 |
| 2022/0045131 | A1* | 2/2022 | Zha | H01L 27/322 |
| 2022/0052121 | A1* | 2/2022 | Jang | H01L 51/5271 |
| 2022/0052136 | A1* | 2/2022 | Wang | H10K 71/00 |
| 2022/0084999 | A1* | 3/2022 | Lee | H01L 33/44 |
| 2022/0102431 | A1* | 3/2022 | Huang | H01L 51/5271 |
| 2022/0115612 | A1* | 4/2022 | Ahn | H10K 59/38 |

(56) References Cited

U.S. PATENT DOCUMENTS

| | | | | |
|---|---|---|---|---|
| 2022/0140019 A1* | 5/2022 | Park | H01L 33/58 | |
| | | | 257/40 | |
| 2022/0140027 A1* | 5/2022 | Jeon | H10K 50/844 | |
| | | | 257/40 | |
| 2022/0149250 A1* | 5/2022 | Nordsell | H01L 33/60 | |
| 2022/0190281 A1* | 6/2022 | Zhao | H10K 50/865 | |
| 2022/0199690 A1* | 6/2022 | Lee | H10K 59/12 | |
| 2022/0208033 A1* | 6/2022 | Ryu | G09F 9/3026 | |
| 2022/0246672 A1* | 8/2022 | Suh | H01L 33/504 | |
| 2022/0246673 A1* | 8/2022 | Suh | H01L 27/156 | |
| 2022/0246684 A1* | 8/2022 | Kim | H10K 59/122 | |
| 2022/0255030 A1* | 8/2022 | Yu | H10K 50/858 | |
| 2022/0276542 A1* | 9/2022 | Ko | H10K 50/85 | |
| 2022/0285447 A1* | 9/2022 | Park | H01L 51/5284 | |
| 2022/0285590 A1* | 9/2022 | Mun | G02B 5/20 | |
| 2022/0320204 A1* | 10/2022 | Wang | H10K 59/38 | |
| 2022/0334424 A1* | 10/2022 | Chen | H10K 59/8723 | |
| 2022/0350196 A1* | 11/2022 | Yao | G02F 1/133516 | |
| 2022/0352101 A1* | 11/2022 | Zhai | H01L 33/62 | |
| 2022/0367434 A1* | 11/2022 | Suh | C09K 11/77 | |
| 2023/0042183 A1* | 2/2023 | Kim | G06F 3/044 | |
| 2023/0085752 A1* | 3/2023 | Yao | H01L 33/005 | |
| | | | 257/79 | |
| 2023/0102283 A1* | 3/2023 | Yu | H01L 33/483 | |
| | | | 257/91 | |
| 2023/0178693 A1* | 6/2023 | Yoon | H01L 33/504 | |
| | | | 257/79 | |
| 2023/0215991 A1* | 7/2023 | Kim | H01L 33/504 | |
| | | | 257/91 | |
| 2023/0253525 A1* | 8/2023 | Lin | H01L 25/0753 | |
| | | | 438/22 | |
| 2023/0275197 A1* | 8/2023 | Kim | H01L 33/505 | |
| | | | 257/91 | |
| 2023/0307426 A1* | 9/2023 | Liu | H01L 25/0753 | |
| 2023/0317696 A1* | 10/2023 | Wu | H01L 25/167 | |
| | | | 257/97 | |
| 2023/0335689 A1* | 10/2023 | Kim | H01L 27/12 | |
| 2023/0345795 A1* | 10/2023 | Yoo | H10K 59/122 | |
| 2023/0378412 A1* | 11/2023 | Jang | H01L 33/0016 | |
| 2024/0096856 A1* | 3/2024 | Murugan | H01L 33/58 | |
| 2024/0170620 A1* | 5/2024 | Moon | H01L 33/387 | |

\* cited by examiner

DISPLAY PANEL AND DISPLAY DEVICE

CROSS-REFERENCE TO RELATED APPLICATIONS

The present disclosure claims priority to Chinese Patent Application No. 202011051459.6, filed on Sep. 29, 2020, the content of which is incorporated herein by reference in its entirety.

TECHNICAL FIELD

The present disclosure relates to the field of display technology, and more particularly, to a display panel and a display device.

BACKGROUND

With the development of information technology, display panels have been more and more widely used. The display panel includes a plurality of pixel units, each pixel unit is constituted by sub-pixels of different emission colors, and mixing of light rays having different colors according to different intensity ratios displays various different colors, thereby achieving full-color display of the display panel.

Currently, for a display panel adopting self-luminous display technology, the sub-pixel includes a light-emitting unit and a color changing layer that are opposed to each other. The light emitted from the light-emitting unit is converted into light having a corresponding color after passing the color changing layer. However, currently, there is a problem of light crosstalk between sub-pixels having different colors. In other words, currently, when the display panel performs displaying, light that should have been emitted from a certain sub-pixel area is emitted from another sub-pixel area adjacent thereto. Also, the current display panel adopting the self-luminous display technology has a low brightness problem due to an insufficient utilization of an intensity of light emitted from the light-emitting units.

SUMMARY

In view of this, the present disclosure provides a display panel and a display device, aiming to alleviate the problem of light crosstalk between sub-pixels having different colors in the display panel, and to increase a brightness of the display panel.

In an aspect, an embodiment of the present disclosure provides a display panel, including: a first substrate comprising a plurality of light-emitting units, a second substrate opposed to the first substrate and comprising a plurality of color changing layers, the plurality of color changing layers in one-to-one correspondence with the plurality of light-emitting units; and a first barrier and second barrier arranged between the first substrate and the second substrate; the first barrier overlaps the second barrier in a thickness direction of the display panel, an optical density of the first barrier is different from an optical density of the second barrier, and a reflectivity of the first barrier is different from a reflectivity of the second barrier.

In another aspect, an embodiment of the present disclosure provides a display device including the display panel described above.

BRIEF DESCRIPTION OF DRAWINGS

In order to more clearly illustrate technical solutions in embodiments of the present disclosure or in the related art, the accompanying drawings used in the embodiments are briefly introduced as follows. It should be noted that the drawings described as follows are merely part of the embodiments of the present disclosure, and other drawings can also be acquired by those skilled in the art based on these drawings without paying creative efforts.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art according to the embodiments of the present disclosure without creative efforts are within the protection scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate three cases, i.e., A exists alone, both A and B exist, B exists alone. In addition, the character "/" herein generally indicates that the related objects in front of and behind the character form an "or" relationship.

It should be understood that although the barrier may be described using the terms "first", "second", etc., in the embodiments of the present disclosure, the barrier will not be limited to these terms. These terms are merely used to distinguish barriers from one another. For example, without departing from the scope of the embodiments of the present disclosure, a first barrier may also be referred to as a second barrier, similarly, a second barrier may also be referred to as a first barrier.

Figure 1:
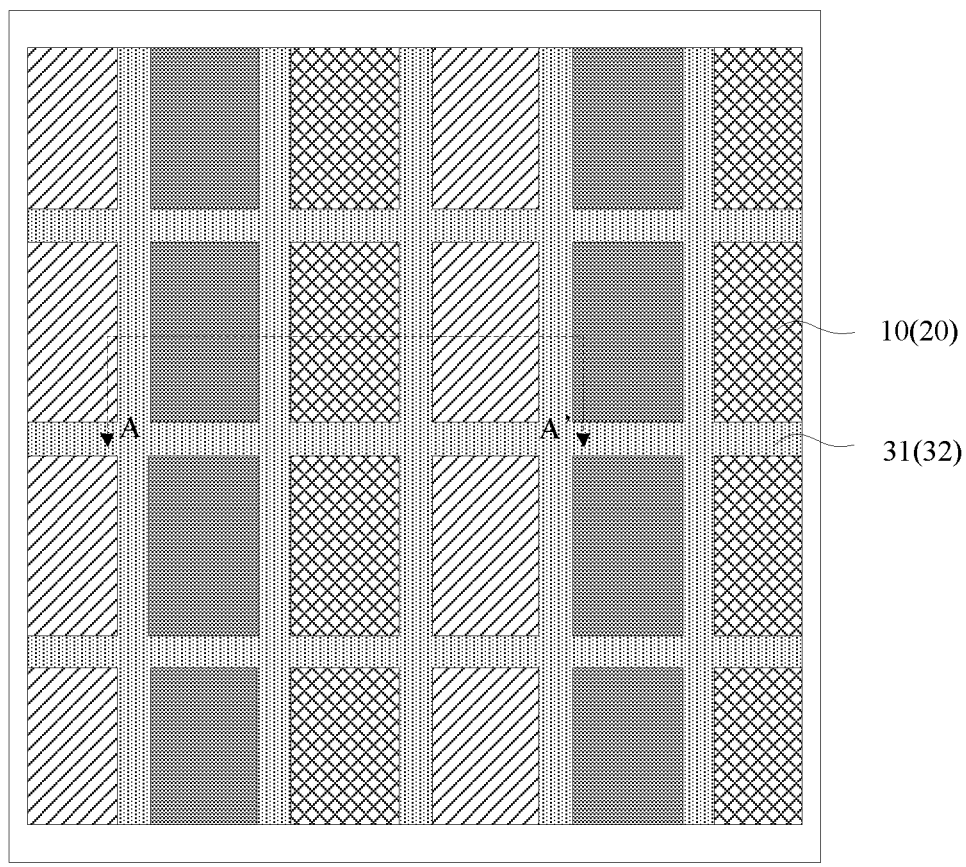
FIG. 1 is an enlarged schematic top view of a display panel according to an embodiment of the present disclosure.

An embodiment of the present disclosure provides a display panel 100, as shown in FIG. 1, which is an enlarged schematic top view of the display panel 100. The display panel 100 includes a plurality of sub-pixels having different colors. Each sub-pixel includes a light-emitting unit 10 and a color changing layer 20 that are opposed to each other. Color changing layers 20 of the sub-pixels having different colors from each other have different emission colors from each other.

Figure 2:
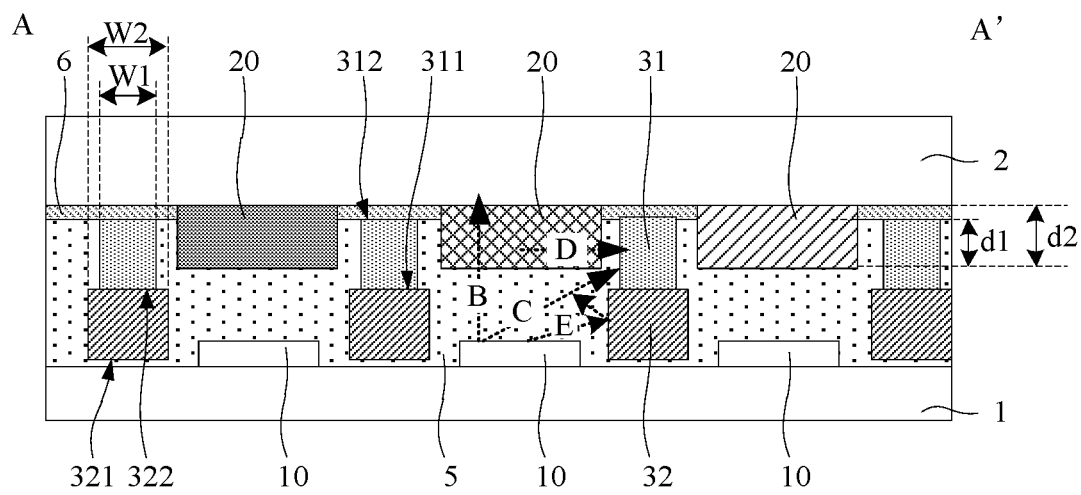
FIG. 2 is a schematic cross-sectional view taken along AA' line in FIG. 1.

FIG. 2 is a schematic cross-sectional view taken along AA' line in FIG. 1. As shown in FIG. 2, the display panel includes a first substrate 1 and a second substrate 2 that are opposed to each other, the first substrate 1 includes a plurality of light-emitting units 10, and a preset space is provided between any two adjacent light-emitting units 10. The second substrate 2 includes a plurality of color changing layers 20, and a corresponding space is provided between any two adjacent color changing layers 20. The plurality of color changing layers 20 corresponds to the plurality of light-emitting units 10 in one-to-one correspondence to form a plurality of sub-pixels in such a manner that each color changing layer 20 and a corresponding light-emitting unit 10 form a respective one sub-pixel. The incident light can be converted into light having a specific color after passing through the color changing layer 20, so that the sub-pixel emits light having a corresponding color.

In this embodiment of the present disclosure, the color changing layers 20 of the sub-pixels having different colors correspond to different emission colors. For example, for a display panel using RGB three-color display technology, a color changing layer having a red emission color corresponds to a red sub-pixel, a color changing layer having a red emission color corresponds to a green sub-pixel, and a color changing layer having a blue emission color corresponds to a blue sub-pixel.

In an example, the color changing layer 20 may include a color resist and/or quantum dots. Here, the color resist can allow transmission of only light having a certain color by filtering out light having other colors. The quantum dots may be formed by photochromic materials, that is, the quantum dots can emit light having a certain color under excitation of light emitted by the light-emitting unit 10. For example, a red color resist and/or red quantum dots can used at a position of the red sub-pixel, and the red color resist allows transmission of red light. The red quantum dots are quantum dots that emit red light under excitation of light emitted by the light-emitting unit. Quantum dots have advantages of concentrated and continuously adjustable emission spectra, and high color purity. In the embodiment of the present disclosure, applying quantum dots to the display panel can effectively increase a color gamut and color reproduction capability of the display panel.

Figure 3:
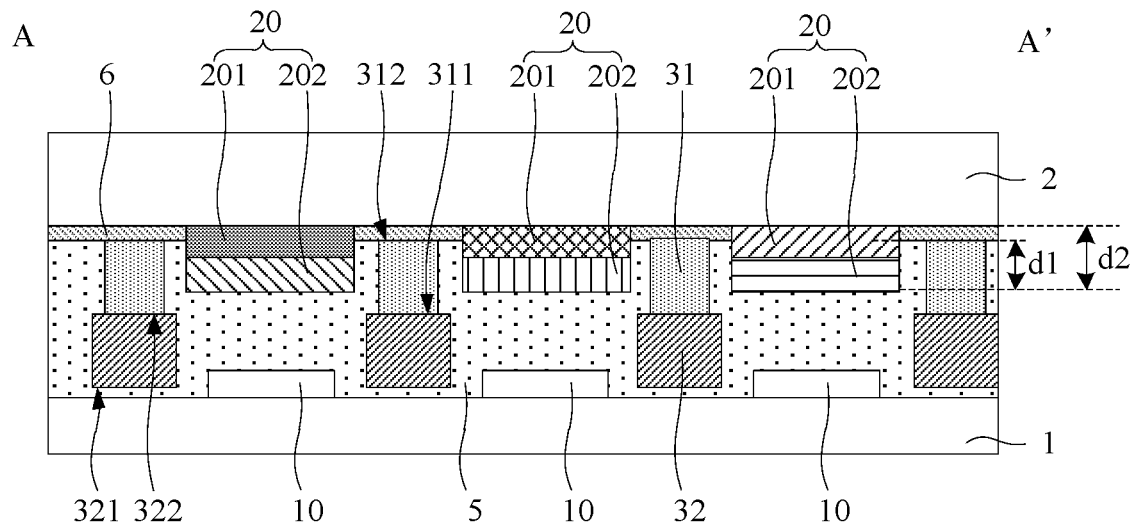
FIG. 3 is another schematic cross-sectional view taken along AA' line in FIG. 1.

In an embodiment of the present disclosure, only quantum dots or only a color resist that emits a color is provided in a color changing layer 20 having the corresponding color, or both quantum dots and a color resist that emit a color are provided in a color changing layer 20 having a corresponding color. In a case where the both quantum dots and the color resist are provided in the color changing layer 20, the quantum dots and the color resist may be stacked. For example, as shown in FIG. 3, which is another schematic cross-sectional view taken along AA' line shown in FIG. 1, the quantum dots 202 are located at a side of the color resist 201 close to the first substrate 1. In this case, light emitted from the light-emitting unit 10 first enters the quantum dots 202, a part of the light is excitation light under which the quantum dots 202 is excited, light excited by the quantum dots 202 is then transmitted through the color resist 201, and the part of the light that is emitted from the light-emitting unit 10 and has not been used as the excitation light of the quantum dots 202 is filtered out by the color resist, so as to achieve a required chromaticity of light emitted from the sub-pixel.

The light-emitting units 10 of sub-pixels having different colors can emit light rays having the same color. For example, a light-emitting unit 10 that emits white light can be respectively provided in the first substrate 1 at a position corresponding to the red sub-pixel, a position corresponding to the green sub-pixel and a position corresponding to the blue sub-pixel. The respective white light emitted by these light-emitting units is converted into red light, green light and blue light after passing through the color changing layers 20 having different colors.

Alternatively, in a case where photochromic quantum dot materials are included in the color changing layers 20, the color changing layers 20 including quantum dots may have a red emission color and a green emission color, and the light-emitting units 10 of the sub-pixels having different colors may emit blue light that has a higher frequency than red light and green light. Under excitation of the blue light, the color changing layers 20 including different quantum dot materials emit red light and green light, respectively. In this case, the color changing layer 20 in the second substrate 2 at the position corresponding to the blue sub-pixel may be made of a transparent material.

Alternatively, in an embodiment of the present disclosure, the light-emitting units 10 of the sub-pixels of different colors may emit light of different colors, respectively. For example, in the first substrate 1, a light-emitting unit that emits red light is provided at a position corresponding to a red sub-pixel, a light-emitting unit that emits green light is provided at a position corresponding to a green sub-pixel, and a light-emitting unit that emits blue light is provided at a position corresponding to the blue sub-pixel.

It should be noted that the light-emitting unit 10 described above may be an organic light-emitting device (OLED). Alternatively, the light-emitting unit 10 may be a blue micro light-emitting diode (Micro-LED). Here, the Micro-LED has a size smaller than or equal to 100 µm. Using the Micro-LED as the light-emitting unit 10 can effectively increase a service life of the display panel, decrease power consumption of the display panel, decrease response time of the display panel, and increase a viewing angle of the display panel.

While the display panel is working, the light-emitting unit 10 emits light, and the light emitted by the light-emitting unit 10 is directed to the corresponding color changing layer 20 (as illustrated by light B in FIG. 2) which then outputs light of the corresponding color, so that the corresponding sub-pixel emits a light ray of a preset color. Light rays having different colors are mixed according to different light intensity ratios to form various colors, so that the display panel can achieve full-color display. Here, a side where the second substrate 2 is located is a light-exit side of the display panel.

As shown in FIG. 2, the display panel further includes a first barrier 31 and a second barrier 32 located between the first substrate 1 and the second substrate 2. The first barrier 31 overlaps the second barrier 32 in a thickness direction of the display panel. In addition, an orthographic projection of the first barrier 31 and an orthographic projection of the second barrier 32 onto the display panel are located at the space between two adjacent light-emitting units 10.

In an embodiment of the present disclosure, an optical density (OD) of the first barrier 31 is different from an optical density of the second barrier 32, and a reflectivity of the first barrier 31 is different from a reflectivity of the second barrier 32. Here, the optical density $OD=-\log(I/I_O)$, where $I_O$ represents an original intensity of a light source, and I represents a light intensity after the light source passes through the optical structure. A larger optical density indicates that the optical structure absorbs more light. A smaller optical density indicates that the optical structure absorbs less light.

In the embodiment of the present disclosure, with the first barrier 31 and the second barrier 32 arranged between the first substrate 1 and the second substrate 2 of the display panel, and the first barrier 31 and the second barrier 32 having different optical densities, the first barrier 31 and the second barrier 32 have different degrees of absorption to light passing different positions or light propagating along different directions in the display panel. In other words, in the embodiments of the present disclosure, the first barrier 31 and the second barrier 32 can differentiate the light propagating in the display panel. For example, as for light that may cause emission light crosstalk between different sub-pixels, a first barrier having a first optical density can be provided in a propagation path of the light; and as for other light that is relatively unlikely to cause the crosstalk, a second barrier having a second optical density different from the first optical density can be provided in a propagation path of the other light. With such configuration, the first barrier 31 and the second barrier 32 have different degrees of absorption to light passing the first barrier 31 and the second barrier 32, thereby not only decreasing a risk of light crosstalk between the sub-pixels having different colors in the display panel, but also avoiding excessive absorption to light in the display panel to cause unnecessary light loss.

In addition, in this embodiment of the present disclosure, with the reflectivity of the first barrier 31 different form the reflectivity of the second barrier 32, on the basis of decreasing the risk of light crosstalk between sub-pixels having different colors in the display panel, light rays propagating in the display panel can also be reflected to different degrees. For example, as for a first light ray that can cause emission light crosstalk between different sub-pixels, the first barrier 31 located in a propagation path of the first light ray may have a first reflectivity; and as for a second light ray that is relatively unlikely to cause color crosstalk, the second barrier 32 located in a propagation path of the second light ray may have a second reflectivity different from the first reflectivity. By reflecting the light rays described above to different degrees, part of the light that will have deviated from the preset propagation path is directed to the corresponding color changing layer 20 after being reflected and is then radiated out from the light-exit side of the display panel. On the basis of decreasing the risk of light crosstalk between the sub-pixels of different colors in the display panel, the light emitted by the light-emitting unit in the display panel can be fully and effectively utilized, thereby increasing luminous brightness of the display panel.

In an embodiment of the present disclosure, one of the first barrier 31 and the second barrier 32 has a relatively large optical density, and the other one of the first barrier 31 and the second barrier 32 has a relatively small optical density. In this case, during radiation of the light emitted from the light-emitting unit 10 of one sub-pixel to the corresponding color changing layer 20, the light emitted by the light-emitting unit 10 can propagate in a plurality of directions, and if a part of light that propagates in a direction deviating from the normal of the display panel is radiated toward a color changing layer having a different emission color near the one sub-pixel (as illustrated by light C in FIG. 2), the first barrier 31 or the second barrier 32 having the relatively large optical density can absorb this part of light, thereby avoiding light crosstalk between the sub-pixels having different colors.

In addition, after light emitted by a light-emitting unit 10 of a sub-pixel of one color is radiated out from the corresponding color changing layer 20, if a part of the light deviates from a normal light-emitting direction during propagating to the light-exit side of the display panel and is directed to an area of another sub-pixel of another color (as illustrated by light D in FIG. 2), the first barrier 31 or the second barrier 32 having the relatively large optical density can also absorb this part of light, thereby preventing this part of light from exiting from the area of another sub-pixel of another color. In this way, a possibility of light crosstalk between sub-pixels having different colors can be further reduced.

Further, in the embodiment of the present disclosure, with the reflectivity of the first barrier 31 being different from the reflectivity of the second barrier 32, that is, one of the first barrier 31 and the second barrier 32 has a relatively large reflectivity, and the other one of the first barrier 31 and the second barrier 32 has a relatively small reflectivity, the light that is emitted by the light-emitting unit 10 and is then reflected by the first barrier 31 or the second barrier 32 having the relatively large reflectivity can be used again. For example, the part of light emitted by the light-emitting unit 10 that is not radiated to the color changing layer 20 having the corresponding color but is directly radiated to the first barrier 31 or the second barrier 32 (as illustrated by light E in FIG. 2) can be reflected by the first barrier 31 or the second barrier 32 having the relatively large reflectivity to the corresponding color changing layer 20 and is then radiated out from the color changing layer 20. With such configuration, emission loss of the light-emitting unit 10 can be decreased, thereby effectively increasing utilization of light emitted from the light-emitting unit 10, and thus increasing an emission intensity of the display panel and increasing the brightness of the display panel.

To sum up, according to the embodiments of the present disclosure, the first barrier 31 or the second barrier 32 having the relative large optical density can be used to absorb the part of light that is emitted from one sub-pixel area but propagates obliquely to a color changing layer 20 of another sub-pixel, thereby decreasing light crosstalk between the sub-pixels having different colors, and thus achieving a required chromaticity of the display panel; and the first barrier 31 or the second barrier 32 having the relatively large reflectivity can be used to reflect the part of light that is emitted by the light-emitting unit 10 and is then not radiated to the corresponding color changing layer 20 but is directly radiated to the barrier, and the reflected light can be radiated to the corresponding color changing layer 20 and is then radiated out from the light-exit side of the display panel, thereby increasing light extraction efficiency of the light-emitting unit 10, and increasing the emission brightness of the display panel. In other words, with the configuration according to the embodiments of the present disclosure, both chromaticity and brightness of the display panel can be increased, thereby effectively increasing the optical effect of the display panel during displaying.

In an embodiment of the present disclosure, one of the first barrier 31 and the second barrier 32 has a relatively large optical density, and the other one of the first barrier 31 and the second barrier 32 has a relatively large reflectivity. For example, the optical density of the first barrier 31 is greater than the optical density of the second barrier 32, and the reflectivity of the second barrier 32 is greater than the reflectivity of the first barrier 31.

In an example, as shown in FIG. 2, the second substrate 2 further includes a black matrix 6 arranged around sub-pixels having different colors. The black matrix 6 is located at a space between two adjacent color changing layers 20, and the apertures of the black matrix 6 correspond to the respective sub-pixels having different colors, thereby avoiding light leakage and color mixing between the sub-pixels having different colors. Moreover, the black matrix 6 can shield various structures in the display panel that are not used for light emission, including wires.

In an embodiment of the present disclosure, each of the optical density of the first barrier 31 and the optical density of the second barrier 32 may be greater than or equal to 1. With such configuration, when light having one color is radiated to an area of a sub-pixel having another color, the light can be absorbed more by the first barrier 31 and the second barrier 32 located between the areas of the two sub-pixels, thereby further decreasing light crosstalk between the sub-pixels having different colors.

In an embodiment of the present disclosure, each of the reflectivity of the first barrier 31 and the reflectivity of the second barrier 32 may be greater than or equal to 40%. With such configuration, when light emitted by the light-emitting unit 10 is radiated to the first barrier 31 and the second barrier 32, most of the light can be reflected by the first barrier 31 and the second barrier 32 each having a relatively great reflectivity, thereby decreasing the loss of light emitted by the light-emitting unit 10, and thus achieving that most of the light emitted by the light-emitting unit 10 can be utilized.

It should be noted that each of the optical density of the first barrier 31 and the optical density of the second barrier 32 is defined with respect to the light having a specific wavelength incident onto the first barrier 31 and the second barrier 32. For example, if the light-emitting unit 10 is a Micro-LED that emits blue light, "each of the optical density of the first barrier 31 and the optical density of the second barrier 32 is greater than 1" means that each of the first barrier 31 and the second barrier 32 has an optical density greater than 1 with respect to blue light. If the light-emitting unit 10 emits other colors, "each of the optical density of the first barrier 31 and the optical density of the second barrier 32 is greater than 1" means that each of the first barrier 31 and the second barrier 32 has an optical density greater than 1 with respect to light having other colors. Similarly, the reflectivity is also defined with respect to light having a specific wavelength, which will not be repeated herein.

In an example, as shown in FIG. 1, an orthographic projection of the first barrier 31 and the second barrier 32 onto a plane of the first substrate 1 at least partially surrounds the light-emitting units 10, so that the first barrier 31 and the second barrier 32 can block the light radiated from an area of one sub-pixel towards a color changing layer 20 located in an area of another sub-pixel in a plurality of directions, thereby further alleviating crosstalk between light rays having different colors that may occur when the display panel performs displaying. Moreover, with such configuration, the light emitted by the light-emitting unit 10 can also be reflected in a plurality of directions, thereby increasing the light utilization efficiency of the light-emitting unit 10.

It should be understood that an arrangement of the sub-pixels having respective colors shown in FIG. 1 is merely for illustration, and the arrangement of the sub-pixels can be designed differently according to different display requirements, which is not limited herein.

In an embodiment, as shown in FIG. 1, the first barrier 31 and/or the second barrier 32 may be formed as a mesh structure including apertures. The apertures of the first barrier 31 or the second barrier 32 expose the color changing layers 20.

The embodiments of the present disclosure provide a variety of different manners for arranging the first barrier 31 and the second barrier 32, which will be described separately in the following.

In an embodiment, the first barrier 31 and the second barrier 32 are stacked. For example, as shown in FIG. 2 and FIG. 3, the first barrier 31 may be disposed at a side of the second barrier 32 close to the second substrate 2. Based on this arrangement manner, in an embodiment, the optical density of the first barrier 31 is greater than the optical density of the second barrier 32, and the reflectivity of the second barrier 32 is greater than the reflectivity of the first barrier 31.

Since the light-emitting unit 10 is provided at the side where the first substrate 1 is disposed, and the second barrier 32 having the relatively large reflectivity is arranged at the side where the first substrate 1 that provides the light source is disposed, light obliquely emitted by the light-emitting unit 10 of a certain sub-pixel can be reflected by the second barrier 32 disposed close to the first substrate 1 and then be used, thereby decreasing emission loss as a result of light absorption, and thus increasing the intensity of the light radiated out from the display panel.

In addition, in the embodiment of the present disclosure, since the first barrier 31 having the relatively large optical density instead of the second barrier 32 having the relatively large reflectivity is provided at the side where the second substrate 2 is disposed, if a part of light emitted by one sub-pixel is radiated toward the color changing layer 20 of another sub-pixel, this part of light will be absorbed by the first barrier 31 between the two adjacent sub-pixel areas, which reduces a probability of crosstalk between light having different colors. Here, light emitted by any sub-pixel includes light that is emitted from the light-emitting unit 10 of the sub-pixel but does not pass the color changing layer 20 of the sub-pixel, and further includes light radiated out from the color changing layer 20 of the sub-pixel.

For example, in a case where the display panel includes a red sub-pixel and a green sub-pixel that are adjacently arranged, and at a certain moment, it is required that the red sub-pixel emits light and the green sub-pixel does not emit light, the color changing layer 20 of the red sub-pixel and the color changing layer 20 of the green sub-pixel respectively includes a red color resist that only transmits red light and a green color resist that only transmits blue light, by filtering out light of other colors. The light-emitting unit 10 includes a white-light OLED. In an ideal case, the white-light OLED in the sub-pixel emits light, and the light emitted by the white-light OLED propagates to the red color resist, as shown by light B in FIG. 2, to make the red sub-pixel emit red light; the white-light OLED in the green sub-pixel does not emit light, and the green sub-pixel does not emit light. However, the following situations may actually occur.

1. The white light emitted by the white-light OLED in the red sub-pixel and radiated to the red color resist is not effectively used, but propagates to the green color resist adjacent thereto, as shown by light D in FIG. 2;

2. The light emitted by the white-light OLED in the red sub-pixel propagates to the green color resist adjacent thereto, as shown by light C in FIG. 2;

3. The light emitted by the white-light OLED in the red sub-pixel propagates to the green sub-pixel adjacent thereto, as shown by light E in FIG. 2.

If the situation 1 and situation 2 occur, the light emitted from the display panel after passing the green color resist will cause the green sub-pixel, which should not have emitted light, to emit light. However, in the embodiment of the present disclosure, because the first barrier 31 having a relatively large optical density is provided at the side where the second substrate 2 including the color changing layer 20 is disposed, even if the situation 1 and the situation 2 occur, the white light radiated towards the green color resist will be absorbed by the first barrier 31 before reaching the green color resist, thereby alleviating light crosstalk between different sub-pixels.

In addition, if more light E is radiated from the red sub-pixel to the green sub-pixel, as for the light-emitting unit 10 having a certain luminous intensity in the red sub-pixel, a proportion of light that is emitted therefrom and radiated to the red sub-pixel will decrease, and thus a luminous brightness of the red sub-pixel will be greatly affected. In the embodiment of the present disclosure, because the second barrier 32 having the relatively large reflectivity is provided at the side where the first substrate 1 (where the light-emitting unit 10 is provided) is disposed, if there is light propagating in the direction shown by the light E as exemplified in the above-mentioned situation 3, then the second barrier 32 can reflect the white light radiated towards the green sub-pixel to prevent the light E from entering the green sub-pixel. Moreover, it is of a high probability that light having a large viewing angle including the light E (i.e., light having a large angle with respect to a normal direction of the display panel) is radiated out by the red color resist after being reflected by the second barrier 32. Therefore, with the second barrier 32, not only the green sub-pixel will not have a light crosstalk issue, but also an intensity of the light emitted from the light-emitting unit 10 towards the red color resist will be increased, thereby increasing the luminous brightness of the red sub-pixel.

In the embodiments of the present disclosure, the arrangement of the first barrier 31 and the second barrier 32 can not only increase an optical effect of the display panel, but also function to support the display panel and avoid crushing the components including the light-emitting unit 10 inside the display panel, increasing pressure resistance of the display panel.

In an embodiment of the present disclosure, with further reference to FIG. 2 and FIG. 3, the first barrier 31 includes a first surface 311 and a second surface 312 that are opposed to each other in the thickness direction of the display panel, and the second surface 312 is closer to the second substrate 2 than the first surface 311. That is, the first surface 311 faces towards to the second barrier 32. The second barrier 32 includes a third surface 321 and a fourth surface 322 that are opposed to each other in the thickness direction of the display panel, and the third surface 321 is closer to the first substrate 1 than the fourth surface 322. That is, the fourth surface 322 faces towards the first barrier 31. In the embodiment of the present disclosure, the fourth surface 322 of the second barrier 32 may contact the first surface 311 of the first barrier 31, and an area of the fourth surface 322 is greater than or equal to an area of the first surface 311. With such configuration, a stacking structure of the first barrier 31 and the second barrier 32 is more stable, thereby further increasing the pressure resistance of the display panel.

In a process for manufacturing the display panel, the first barrier 31 and the second barrier 32 may be formed in a process for manufacturing the first substrate 1, or may be formed in a process for manufacturing the second substrate 2; or the first barrier 31 close to the second substrate 2 is formed in a process for manufacturing the second substrate 2, and the second barrier 32 close to the first substrate 1 is formed in a process for manufacturing the first substrate 1, which will not be limited herein by the embodiments of the present disclosure.

After the first substrate 1 and the second substrate 2 are manufactured, the first substrate 1 and the second substrate 2 can be bonded together with an adhesive material. As shown in FIG. 2 and FIG. 3, an optically clear adhesive (OCA) 5 can be used to bond the first substrate 1 and the second substrate 2 together.

In an embodiment, a total height of the first barrier 31 and the second barrier 32 is smaller than a distance between the first substrate 1 and the second substrate 2, and the optically clear adhesive 5 is filled in the space between the third surface 321 of the second barrier 32 and the first substrate 1, thereby improving bonding stability of the two substrates.

Figure 4:
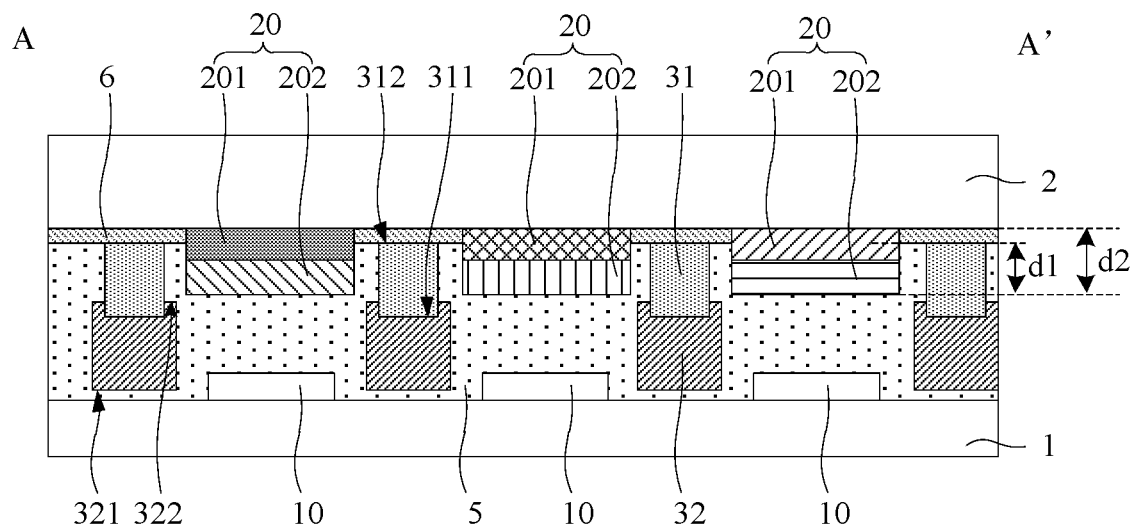
FIG. 4 is still another schematic cross-sectional view taken along AA' line in FIG. 1.

FIG. 4 is still another schematic cross-sectional view taken along AA' line shown in FIG. 1. In an embodiment, as shown in FIG. 4, the second barrier 32 wraps at least an end of the first barrier 31 facing the first substrate 1. When the display panel displays, the side with the second substrate 2 and serving as the light-exit side of the display panel, is usually disposed at an upper position. In this embodiment of the present disclosure, because the second barrier 32 arranged at a relatively lower position wraps an end of the first barrier 31 arranged at a relatively upper position, positional stability of the first barrier 31 and the second barrier 32 can be improved, thus increasing structural stability of the display panel.

Figure 5:
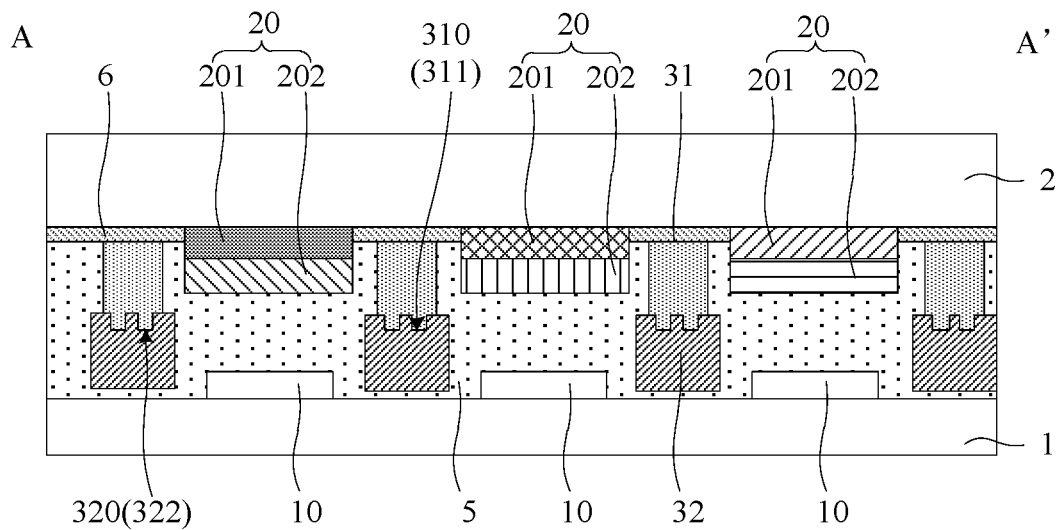
FIG. 5 is still another schematic cross-sectional view taken along AA' line in FIG. 1.

FIG. 5 is still another schematic cross-sectional view taken along AA' line shown in FIG. 1. In an embodiment, as shown in FIG. 5, the first barrier 31 contacts the second barrier 32, and a surface of the first barrier 31 contacting the second barrier 32, (i.e., the first surface 311) includes a convex structure 310; a surface of the second barrier 32 contacting the first barrier 31 (i.e., the fourth surface 322) includes a concave structure 320. The convex structure 310 is engaged with the concave structure 320. Compared with the configuration in which the first surface 311 and the fourth surface 322 are flat surfaces, the configuration shown FIG. 5 can increase a contact area between the first barrier 31 and the second barrier 32, so that the stacking structure of the first barrier 31 and the second barrier 32 can be more stable, reducing the risk of relative displacement between the first barrier 31 and the second barrier 32 when pressing or other operations is performed on the display panel. In an embodiment, the first surface 311 includes a plurality of convex structures 310, and the fourth surface 322 includes a plurality of concave structures 320.

In an embodiment, in the case where the color changing layer 20 includes the quantum dots 202, the color changing layer 20 overlap the first barrier 31 in a direction parallel to the display panel, and the color changing layer 20 does not overlap the second barrier 32 in the direction parallel to the display panel.

Figure 6:
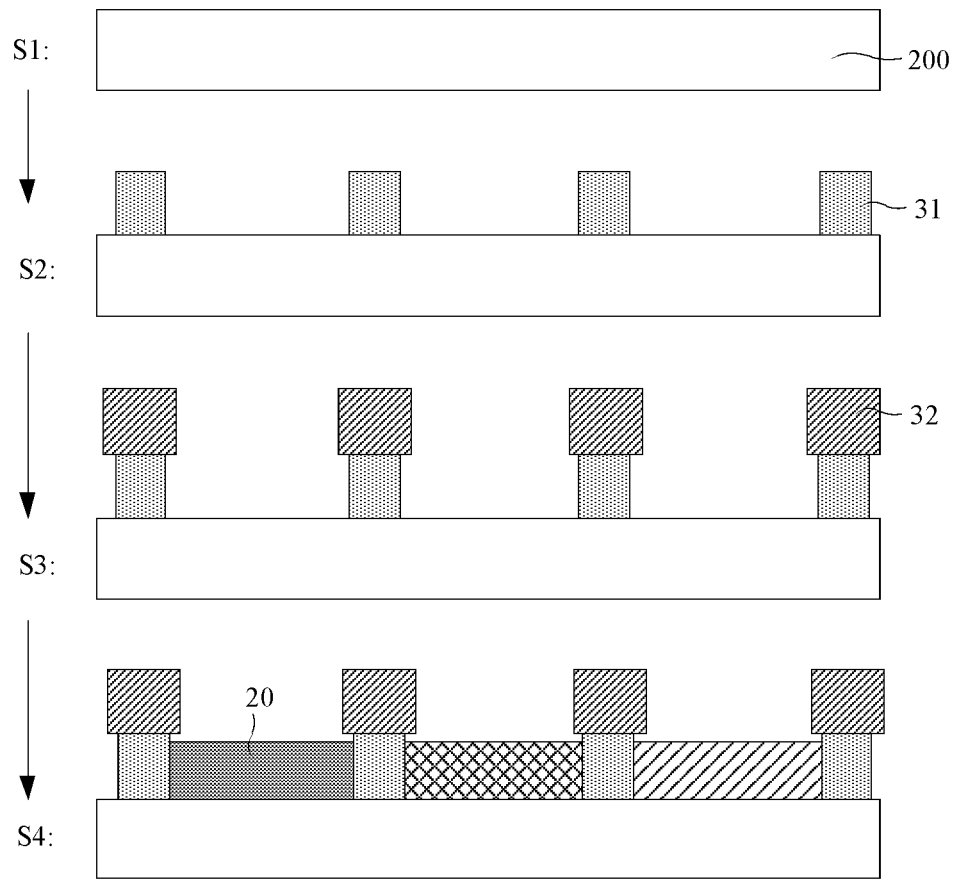
FIG. 6 is a schematic flowchart of a method for manufacturing a second substrate according to an embodiment of the present disclosure.

FIG. 6 is a schematic flowchart of a manufacturing method of the second substrate according to an embodiment of the present disclosure. In a case where the first barrier 31 and the second barrier 32 are arranged at a side with the second substrate 2, as shown in FIG. 6, the manufacturing method includes the following steps S1 to S4.

At step S1, a substrate 200 is provided.

At step S2, first barriers 31, which are spaced from each other by a preset space, are formed on a side of the substrate 200, and the first barriers 31 are disposed in a non-light-emitting area of the substrate 200.

At step S3, second barriers 32 are formed on a side of the first barriers 31 facing away from the substrate 200.

At step S4, a color changing layer 20 including quantum dots is formed in the space between adjacent first barriers 31. An initial state of the quantum dots is generally in liquid form. Processes such as spin coating or printing are generally used to form the quantum dots in the space between adjacent first barriers 31. Since the first barrier 31 is made of a different material from the second barrier 32, wettability of the liquid quantum dot material to the first barrier 31 is different from wettability of the liquid quantum dot material to the second barrier 32. With the method provided by the embodiment of the present disclosure, by controlling heights of the quantum dots and the first barrier 31 in such a manner that the color changing layer 20 including the quantum dots overlaps only the first barrier 31 and does not overlap the second barrier 32 in a direction parallel to the display panel, the liquid quantum dot material does not contact an interface between the first barrier 31 and the second barrier 32, avoiding a problem of poor contact, e.g., bubbles at an edge of the quantum dots caused by difference in wettability of the quantum dots to the first barrier 31 and to the second barrier 32.

It should be noted that, in the schematic flowchart shown in FIG. 6, the manufacturing method of the second substrate 2 is only described by taking the color changing layer 20 being a single layer structure as an example, and the color changing layer 20 may be a stacking structure including a color resist and quantum dots, which will not be repeated herein.

In an embodiment of the present disclosure, with reference to FIG. 2, in a direction parallel to the display panel, a height d1 of an overlapping area between the color changing layer 20 and the first barrier 31 and a height d2 of the color changing layer 20 satisfy: $d1 \geq 0.5*d2$. With such configuration, the light radiated from the color changing layer 20 can be better confined in an area of the sub-pixel having the corresponding color by the first barrier 31, thereby further avoiding crosstalk between light having different colors.

In an embodiment, the first barrier 31 and the color changing layer 20 completely overlap each other in a direction parallel to the display panel, that is, d1=d2. In other words, the color changing layer 20 is arranged between a plane of the first surface 311 of the first barrier 31 and a plane of the second surface 312 of the first barrier 31, so that the horizontal light radiated from the color changing layer 20 can be confined in an area of the corresponding sub-pixel to the maximum extent.

In an embodiment, as shown in FIG. 2, in a direction parallel to the display panel, a width W2 of the second barrier 32 is greater than a width W1 of the first barrier 31. Because the second barrier 32 has a relatively large width, the second barrier 32 has an increased blocking effect on the light radiated thereto. If light propagates between two adjacent sub-pixels, the second barrier 32 with strong light blocking effect can reduce a probability of light propagating from one sub-pixel to another sub-pixel, thereby further avoiding light crosstalk between the two adjacent sub-pixels. Moreover, as a distance between the second barrier 32 and the color changing layer 20 is relatively large, and an area of the color changing layer 20 is determined by a distance between two adjacent first barriers 31, in this embodiment of the present disclosure, increasing the width of the second barrier 32 not only reduces light crosstalk between two adjacent sub-pixels, but also achieves that the area of the color changing layer 20 will not decrease, that is, a required aperture ratio of the sub-pixels can be achieved.

Figure 7:
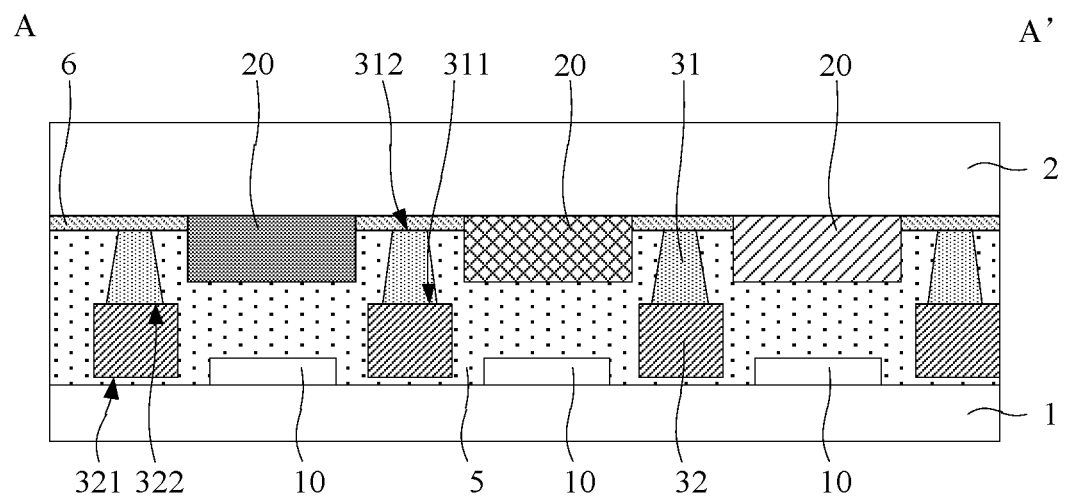
FIG. 7 is still another schematic cross-sectional view taken along AA' line in FIG. 1.

FIG. 7 is still another schematic cross-sectional view taken along AA' line shown in FIG. 1. As shown in FIG. 7, in an embodiment of the present disclosure, an area of the first surface 311 of the first barrier 31 is greater than or equal to an area of the second surface 312 of the first barrier 31, that is, a cross-sectional shape of the first barrier 31 is designed as a trapezoid as shown in FIG. 7, with an upper bottom of the trapezoid facing the second substrate 2 and a lower bottom of the trapezoid facing the first substrate 1. Here, the upper bottom of the trapezoid refers to a bottom side of the trapezoid having a relatively small length, and the lower bottom of the trapezoid refers to a bottom side of the trapezoid having a relatively large length. With such configuration, when the first substrate 1 and the second substrate 2 are bonded together to form the display panel, during the process that the emitted light is radiated from the light-emitting unit 10 towards the light-exit side of the display panel, an aperture defined by two adjacent first barriers 31 has an opening area gradually increasing in a direction from the first surface 311 towards the second surface 312, which can increase an light-exit angle of the light, thus increasing the viewing angle of the display panel and improving the optical effect under a large viewing angle. Moreover, with such a configuration, an aperture defined by two adjacent first barriers 31 has an opening area gradually increasing in a direction from the first surface 311 towards the second surface 312, and if a part of light emitted from the color changing layer 20 is scattered or reflected to cause a change of a propagation direction thereof and the changed propagation direction is closer to the side where the first substrate 1 is disposed, this part of light will pass the apertures having a gradually increasing area during propagating from the color changing layer 20 towards the side where the first substrate 1 is disposed, and therefore this part of light can be absorbed more by the first barrier 31 defining the aperture, thereby reducing an intensity of the part of light reaching the side where the first substrate 1 is disposed without affecting a dimension of the aperture of the pixel of the display panel.

In addition, in the embodiment of the present disclosure, with the cross-sectional shape of the first barrier 31 designed as a trapezoid as shown in FIG. 7, a contact area between the first barrier 31 and the second barrier 32 is relatively increased, and therefore structural stability of the first barrier 31 and the second barrier 32 is increased, thereby increasing structural stability of the display panel.

Figure 8:
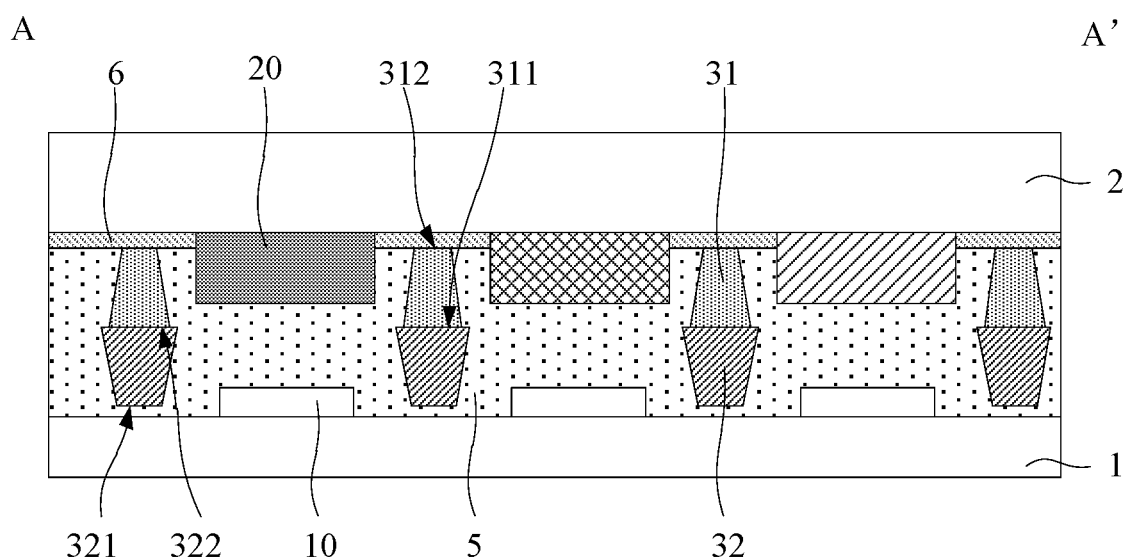
FIG. 8 is still another schematic cross-sectional view taken along AA' line in FIG. 1.
Figure 9:
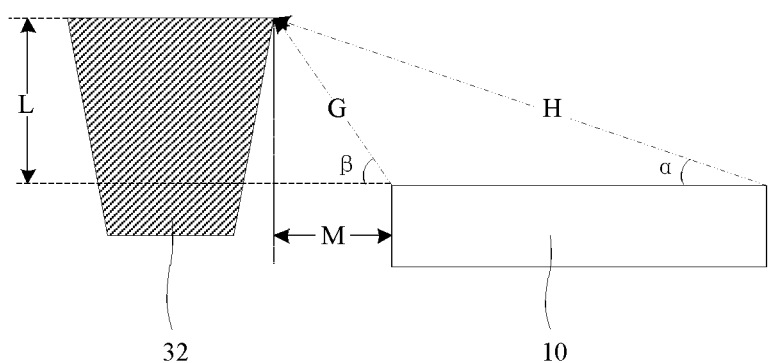
FIG. 9 is a schematic diagram showing that light emitted by a light-emitting unit passes a second barrier having a cross section in an inverted trapezoidal shape.
Figure 10:
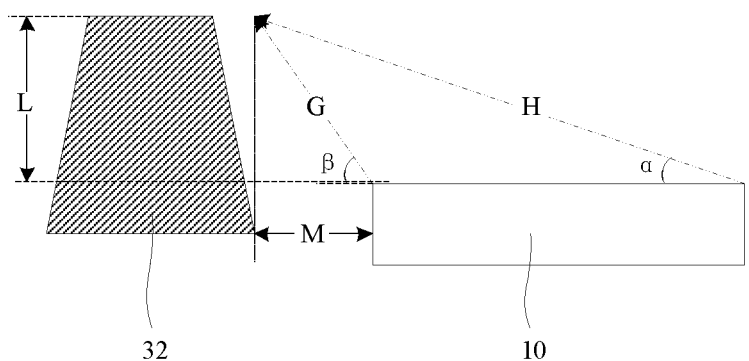
FIG. 10 is a schematic diagram showing that light emitted by the light-emitting unit passes a second barrier having a cross section in a regular trapezoidal shape.

FIG. 8 is still another schematic cross-sectional view taken along AA' line shown in FIG. 1. In an embodiment, as shown in FIG. 8, an area of the third surface 321 of the second barrier 32 is smaller than or equal to an area of the fourth surface 322 of the second barrier 32, that is, a cross-sectional shape of the second barrier 32 is designed as an inverted trapezoid as shown in FIG. 8, with an upper bottom of the trapezoid facing the first substrate 1 and a lower bottom of the trapezoid facing the second substrate 2. Here, the upper bottom of the trapezoid refers to a bottom side of the trapezoid having a relatively small length, and the lower bottom of the trapezoid refers to a bottom side of the trapezoid having a relatively large length. With such configuration, a width of the second barrier 32 gradually increases along a direction from the third surface 321 towards the fourth surface 322. Compared with a case in which the width of the second barrier 32 decreases along the direction from the third surface 321 towards the fourth surface 322, i.e., comparing FIG. 9 and FIG. 10 (FIG. 9 is a schematic diagram showing that light emitted by a light-emitting unit passes a second barrier having a cross section in an inverted trapezoidal shape; and FIG. 10 is a schematic diagram showing that light emitted by the light-emitting unit passes a second barrier having a cross section in a regular trapezoidal shape), it can be seen that, in the two configurations, a horizontal distance between the second barrier 32 and an edge of the light-emitting unit 10 has an identical value of M, and a vertical distance between an upper surface of the second barrier 32 and a light-exit surface of the light-emitting unit 10 has an identical value of L; and both the light G and light H emitted by the light-emitting unit 10 shown in FIG. 9 can pass the second barrier 32, but light G and light H that are emitted by the light-emitting unit 10 shown in FIG. 10 and have the same propagation directions as in FIG. 9 cannot be reflected by the second barrier 32 and may be radiated to a sub-pixel at another position. Therefore, it can be seen that the second barrier 32 having an inverted trapezoidal cross-sectional shape can reflect more light obliquely emitted by the light-emitting unit 10, thereby more effectively improving utilization of light emitted by the light-emitting unit 10, and thus decreasing the loss of light emitted by the light-emitting unit 10.

Moreover, while achieving that the light having a large angle emitted by the light-emitting unit 10 is reflected, the design of the second barrier 32 having an inverted trapezoidal cross-sectional shape as shown in FIG. 8 and FIG. 9 can decrease an area of an end of the second barrier 32 close to the first substrate 1 compared with the design of the second barrier having a rectangular cross-sectional shape. In the embodiments of the present disclosure, when the light-emitting unit 10 is a Micro-LED, due to a small size of the Micro-LED and high process accuracy requirements, in the process for forming the display panel, especially when the process for forming the second barrier 32 is integrated into the process for manufacturing the first substrate 1 (i.e., the second barrier 32 is formed at the side where the first substrate 1 is disposed), the second barrier 32 having a smaller area at a side close to the first substrate 1 can decrease an influence on the Micro-LED. When the process for the second barrier 32 is integrated into the process for manufacturing the second substrate 2 (i.e., the second barrier 32 is formed at the side where the second substrate 2 is disposed), during the alignment and bonding process after the first substrate 1 and the second substrate 2 are manufactured, the second barrier 32 having a smaller area at a side close to the first substrate 1 can avoid blocking the Micro-LED, and also allows more easier alignment of the second barrier 32 with a gap between two adjacent Micro-LEDs.

Figure 11:
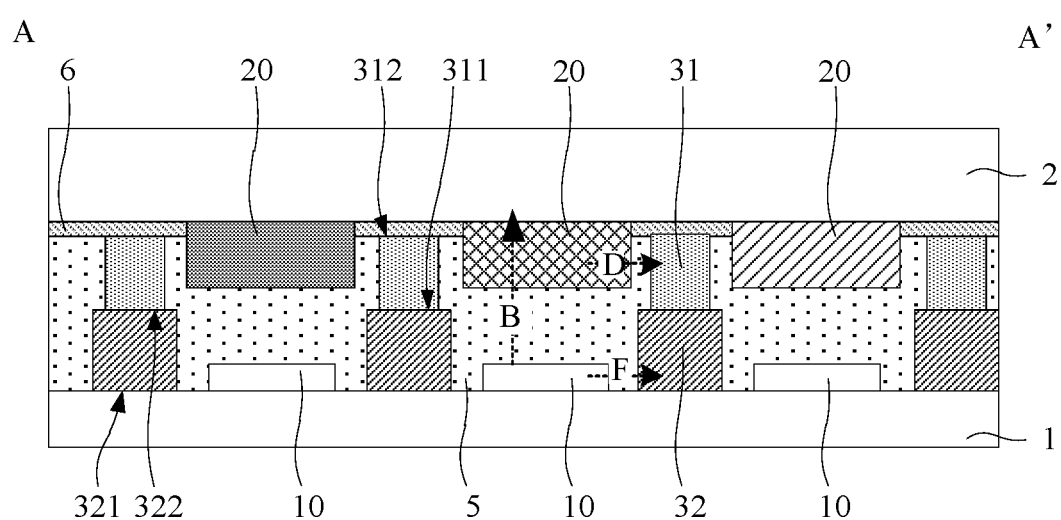
FIG. 11 is still another schematic cross-sectional view taken along AA' line in FIG. 1.

FIG. 11 is still another schematic cross-sectional view taken along AA' line shown in FIG. 1. Alternatively, in some embodiments of the present disclosure, as shown in FIG. 11, identical features in the embodiment shown in FIG. 11 with the foregoing embodiments will not be repeated herein, and the difference from the foregoing embodiments lies in that: the optical density of the first barrier 31 close to the second substrate 2 is smaller than the optical density of the second barrier 32 close to the first substrate 1, and the reflectivity of the second barrier 32 close to the first substrate 1 is smaller than the reflectivity of the first barrier 31 close to the second substrate 2. With such configuration, when the light-emitting units 10 of the sub-pixels have the same emission color, and the color changing layers 20 of the sub-pixels each have a material that is selective to the color of the incident light, light crosstalk between the light-emitting units 10 of different sub-pixels can be avoided, thereby ameliorating light crosstalk between the sub-pixels having different colors.

In an embodiment, the display panel includes a red sub-pixel and a green sub-pixel that are adjacently arranged, the color changing layer 20 of each of the red sub-pixel and the green sub-pixel includes quantum dots, and the light-emitting unit 10 of each of the red sub-pixel and the green sub-pixel includes blue-light Micro-LED. When it is required that the red sub-pixel emits light and the green sub-pixel does not emit light at a certain moment, in a ideal case, the blue-light Micro-LED in the red sub-pixel emits light, and the light emitted by the blue-light Micro-LED propagates to the red quantum dots, as shown by light B in FIG. 2, to excite the red quantum dots to emit red light; and the blue-light Micro-LED in the green sub-pixel does not emit light, the green quantum dots are not excited, and therefore the green sub-pixel does not emit light. However, the following situation may actually occur: a part of blue light emitted by the blue-light Micro-LED in the red sub-pixel propagates to a position of the blue-light Micro-LED of the green sub-pixel adjacent thereto, as shown by light F in FIG. 11, and if this part of blue light propagates toward the light-exit side of the display panel, it will be radiated to the green quantum dots. The green quantum dots will be excited to emit green light, causing the green sub-pixel which should have not emitted light, to emit light.

In the embodiment of the present disclosure, since the second barrier 32 having the relatively large optical density is provided at the side where the first substrate 1 including the light-emitting unit 10 is disposed, the blue light radiated to the light-emitting unit of the green sub-pixel can be absorbed by the second barrier 32, thereby avoiding radiating this part of blue light subsequently to the green quantum dots, and thus alleviating light crosstalk between different sub-pixels.

In an embodiment, as shown in FIG. 11, the second barrier 32 overlaps the light-emitting unit 10 in a direction parallel to the display panel, so that the light emitted by the light-emitting unit 10 and having a large angle with respect to the normal direction of the display panel can be absorbed more by the second barrier 32, thereby further avoiding crosstalk between light having different colors. In an embodiment of the present disclosure, the light-emitting unit 10 completely overlaps the second barrier 32 in the direction parallel to the display panel, that is, the light-emitting unit 10 is arranged between a plane of the third surface 321 of the second barrier 32 and a plane of the fourth surface 322 of the second barrier 32, so that the light emitted from the light-emitting unit 10 and having the large angle can be confined in an area of the corresponding sub-pixel to the maximum extent.

In addition, with the above-mentioned configuration, if a part of red light excited from the red quantum dots propagates to the green quantum dots adjacent thereto, as shown by light D shown in FIG. 11, since the green quantum dots will not be excited by the red light, this part of red light will have a small influence on color crosstalk. Therefore, in this embodiment of the present disclosure, by providing the first barrier 31 having a relatively large reflectivity at the side where the second substrate 2 including the color changing layer 20 is disposed, the part of red light emitted from the red quantum dots can be confined in an area of the red sub-pixel due to reflection of the first barrier 31. In this way, loss of red light can be reduced, thus improving the emission brightness of the red sub-pixel.

The above description is an exemplary description of the structure of the display panel provided by the embodiments of the present disclosure by taking the stacking structure of the first barrier 31 and the second barrier 32 as an example. In addition, in an embodiment of the present disclosure, the height of the second barrier 32 may be greater than or equal to the height of the first barrier 31, and the second barrier 32 at least partially wraps the first barrier 31.

Figure 12:
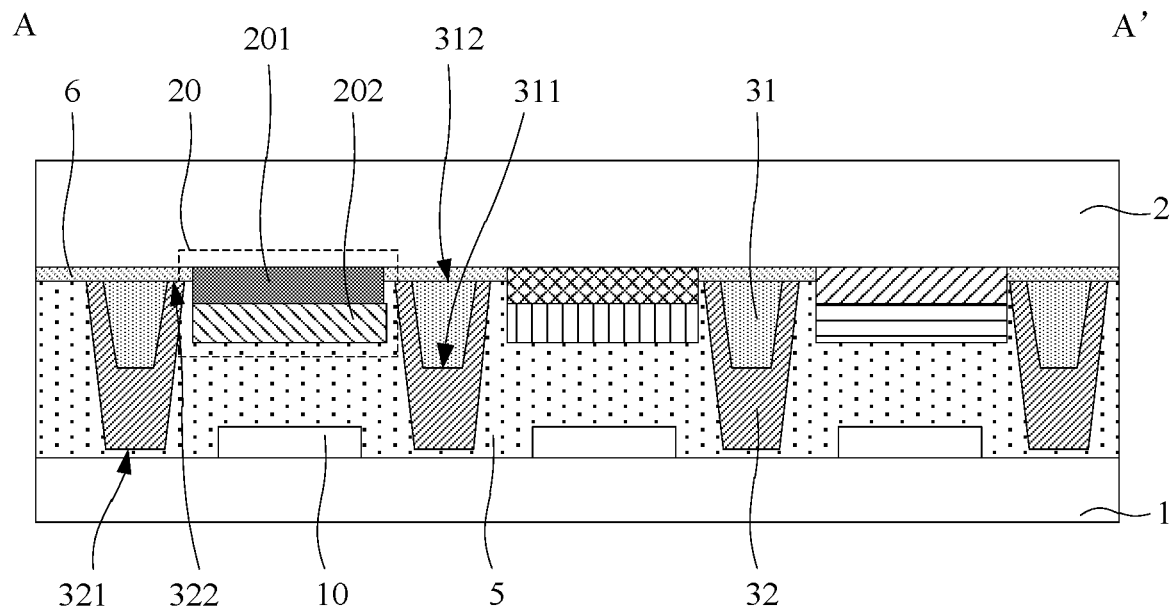
FIG. 12 is still another schematic cross-sectional view taken along AA' line in FIG. 1.

FIG. 12 is still another schematic cross-sectional view along AA' shown in FIG. 1. In an embodiment, as shown in FIG. 12, in the thickness direction of the display panel, the height of the second barrier 32 is greater than or equal to the height of the first barrier 31, and the second barrier 32 at least partially wraps the first barrier 31. In the embodiment shown in FIG. 12, in the direction parallel to the display panel, the width of the second barrier 32 is greater than the width of the first barrier 31; the first surface 311 of the first barrier 31 and the two side surfaces connected to the first surface 311 are all wrapped by the second barrier 32; and the distance between the first barrier 31 and the second substrate 2 is smaller than or equal to the distance between the first barrier 31 and the first substrate 1. In an embodiment of the present disclosure, based on the configuration shown in FIG. 12, the optical density of the first barrier 31 is greater than the optical density of the second barrier 32, and the reflectivity of the second barrier 32 is greater than the reflectivity of the second barrier 32.

With such configuration, the first barrier 31 having a relatively large optical density can be used to absorb the light that is emitted from an area of a certain sub-pixel and propagates obliquely to the color changing layer 20 of another sub-pixel, thereby decreasing optical crosstalk between the sub-pixels of different colors in the display panel; meanwhile, the barrier having a relatively large reflectivity can be used to reflect the light that is emitted from the light-emitting unit 10 and is not radiated to the corresponding color changing layer 20 but is directly radiated to the barrier, and the reflected light can be radiated to the corresponding color changing layer 20 and then radiated out from the light-exit side of the display panel, thereby increasing a light extraction efficiency of the light-emitting unit 10 and thus increasing the emission brightness of the display panel. Moreover, with the structure shown in FIG. 12, a contact area between the first barrier 31 and the second barrier 32 can further increase, further improving the positional stability of the first barrier 31 and the second barrier 32.

Figure 13:
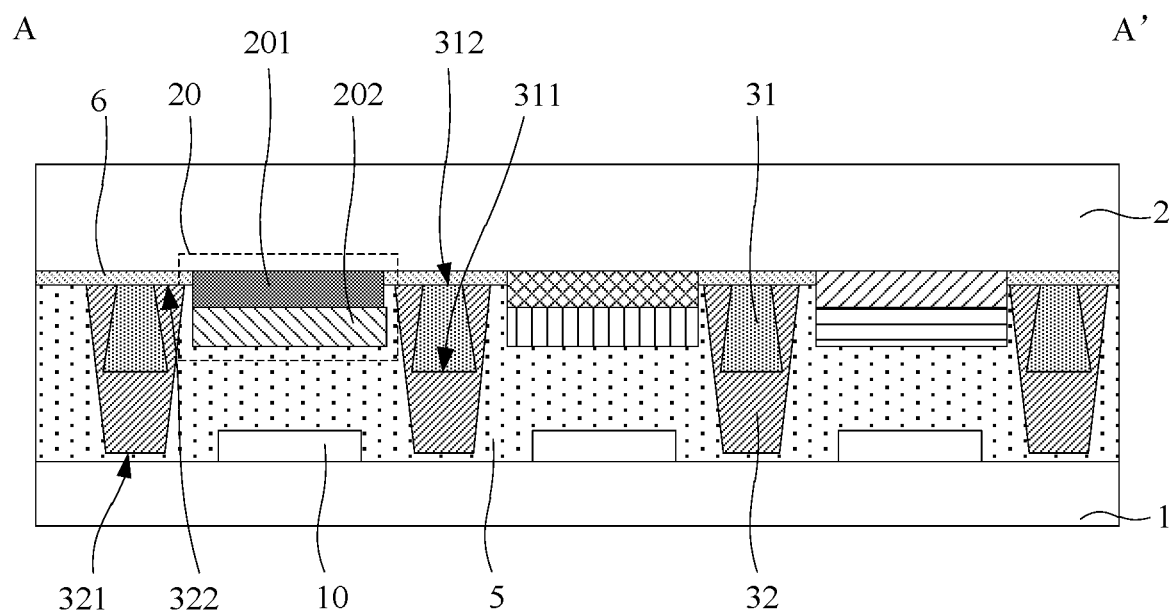
FIG. 13 is still another schematic cross-sectional view taken along AA' line in FIG. 1.

FIG. 13 is still another schematic cross-sectional view taken along AA' line shown in FIG. 1. In an embodiment as shown in FIG. 13, on the basis that the height of the second barrier 32 is greater than or equal to the height of the first barrier 31, and the second barrier 32 at least partially wraps the first barrier 31, an area of the first surface 311 of the first barrier 31 is greater than or equal to an area of the second surface 312 of the first barrier 31, thereby increasing the light-exit angle of the light, thus increasing the viewing angle of the display panel and improving the optical effect under the large viewing angle. Moreover, with the configuration shown in FIG. 13, the first barrier 31 and the second barrier 32 may form a locking structure, thereby further improving the positional stability of the first barrier 31 and the second barrier 32 and thus preventing relative displacement between the first barrier 31 and the second barrier 32.

With further reference to FIG. 13, an embodiment of the present disclosure can provide that an area of the third surface 321 of the second barrier 32 is smaller than or equal to an area of the fourth surface 322 of the second barrier 32, so as to reflect more light obliquely emitted from the light-emitting unit 10, thereby further increasing utilization of the light emitted from the light-emitting unit 10, and thus further decreasing loss of the light emitted from the light-emitting unit 10.

In an embodiment, in the process for manufacturing the display panel designed as shown in FIG. 12 and FIG. 13, if the light-emitting unit is a blue-light Micro-LED, an embodiment of the present disclosure can provide that the process for forming the first barrier 31 and the second barrier 32 is integrated into the process for forming the second substrate 2. Compared with the scheme in which the process for forming the first barrier 31 and the second barrier 32 is integrated into the process for forming the first substrate 1, this embodiment can prevent the process for forming the first barrier 31 and the second barrier 32 from affecting the process of the Micro-LED at the side where the first substrate 1 is disposed. Due to a small size of the Micro-LED, process difficulty and process requirements of the Micro-LED are relatively large. Therefore, this embodiment of the present disclosure can improve reliability of the manufactured display panel by avoiding forming the first barrier 31 and the second barrier 32 at the side where the first substrate 1 is disposed.

In addition, in the process for manufacturing the display panel with the configuration as shown in FIG. 12 and FIG. 13, integrating the process for forming the first barrier 31 and the second barrier 32 into the process for forming the second substrate 2 can reduce the distance between the first and second barrier 31, 32 and the color changing layer 20 at the side where the second substrate 2 is disposed, with respect to the light-emitting unit 10 at the side where the substrate 1 is disposed. Since the color changing layer 20 is closely related to the color of the light emitted from the sub-pixel, this configuration can reduce crosstalk between light rays emitted from different sub-pixels to the maximum extent.

With reference to the above embodiments, in order to make the first barrier 31 and the second barrier 32 meet the requirements in optical density and reflectivity as described above, in a process for forming the first barrier 31 and the second barrier 32, doping particles of different particle sizes or different materials may be doped in the base materials forming the first barrier 31 and the second barrier 32. The difference in the particle size or material of the doped particles can provide different optical effects on the light radiated thereto. For example, the first barrier 31 may have a yellow color due to the selected particle sizes of the doping particles, so that the second barrier 32 can have a gray color. In the case where the light-emitting unit is a blue-light Micro-LED, the first barrier 31 having a yellow color has a higher absorption rate for blue light, and the second barrier 32 having a gray color has a higher reflectivity to blue light.

Figure 14:
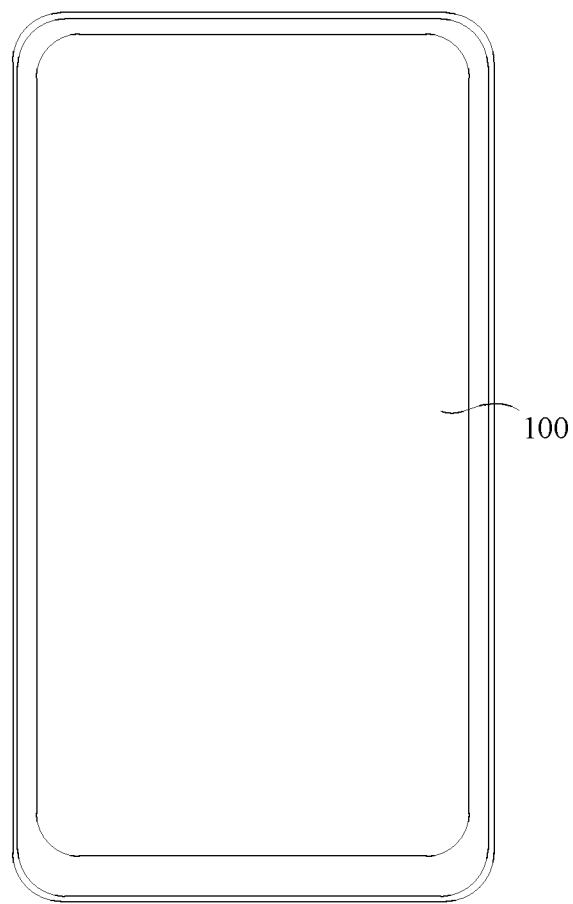
FIG. 14 is a schematic diagram of a display device according to an embodiment of the present disclosure.

An embodiment of the present disclosure further provides a display device, as shown in FIG. 14, which is a schematic diagram of a display device according to an embodiment of the present disclosure. The display device includes the display panel described above. Here, the structure of the display panel 100 has been described in detail in the above embodiments, and will not be repeated herein. It should be noted that the display device shown in FIG. 14 is merely for schematic illustration, and the display device may be any electronic device with a display function, such as a mobile phone, a tablet computer, a notebook computer, an electronic paper book, or a television.

With the display device provided by the embodiments of the present disclosure, the barrier having a relatively large optical density can be used to absorb the light that is emitted from an area of a certain sub-pixel and propagates obliquely to the color changing layer of another sub-pixel, thereby decreasing crosstalk between light rays emitted from the sub-pixels having different colors in the display panel; meanwhile, the barrier having a relatively large reflectivity can be used to reflect the light that is emitted from the light-emitting unit and is not radiated to the corresponding color changing layer but is directly radiated to the barrier, and the reflected light can be radiated to the corresponding color changing layer and then radiated out from the light-exit side of the display panel, thereby increasing a light extraction efficiency of the light-emitting unit 10 and thus increasing the luminous brightness of the display panel. In other words, with the embodiments of the present disclosure, both the required chromaticity and the required brightness of the display device can be achieved, thereby effectively improving the optical effect of the display device during displaying.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
  a first substrate comprising a plurality of light-emitting units,
  a second substrate opposed to the first substrate and comprising a plurality of color changing layers, the plurality of color changing layers spaced from and in one-to-one correspondence with the plurality of light-emitting units; and
  a first barrier and a second barrier arranged between the first substrate and the second substrate,
  wherein the first barrier overlaps the second barrier in a thickness direction of the display panel, an optical density of the first barrier is different from an optical density of the second barrier, and a reflectivity of the first barrier is different from a reflectivity of the second barrier,
  wherein the first barrier is arranged at a side of the second barrier close to the second substrate, and in a direction parallel to a plane of the display panel, one of the plurality of light-emitting units overlaps the second barrier,
  wherein the second barrier is spaced from the plurality of light-emitting units by an optically clear adhesive, and in the thickness direction of the display panel, a distance between an uppermost surface of the second barrier and the second substrate is smaller than a distance between an uppermost surface of the plurality of light-emitting units and the second substrate, a distance between a lowermost surface of the second barrier and the second substrate is smaller than a distance between a lowermost surface of the plurality of light-emitting units and the second substrate, and the distance between the lowermost surface of the second barrier and the second substrate is larger than the distance between the uppermost surface of the plurality of light-emitting units and the second substrate; and
  wherein the first barrier directly contacts the second barrier, and in the thickness direction of the display panel, a distance between a lowest surface of the first barrier and the first substrate is smaller than a distance between a lowermost surface of the plurality of color changing layers and the first substrate, a distance between a uppermost surface of the first barrier and the first substrate is smaller than a distance between an uppermost surface of the plurality of color changing layers and the first substrate, and the distance between the uppermost surface of the first barrier and the first substrate is larger than the distance between the lowermost surface of the plurality of color changing layers and the first substrate.

2. The display panel according to claim 1, wherein the optical density of the first barrier and the optical density of the second barriers are greater than or equal to 1, and both the reflectivity of the first barrier and the reflectivity of the second barrier are greater than or equal to 40%.

3. The display panel according to claim 1, wherein the optical density of the first barrier is greater than the optical density of the second barrier, and the reflectivity of the second barrier is greater than the reflectivity of the first barrier.

4. The display panel according to claim 3, wherein the first barrier comprises a first surface and a second surface that are opposed to each other in the thickness direction of the display panel, and the second surface is closer to the second substrate than the first surface,
  wherein the second barrier comprises a third surface and a fourth surface that are opposed to each other in the thickness direction of the display panel, and the third surface is closer to the first substrate than the fourth surface,
  wherein an area of the fourth surface is greater than or equal to an area of the first surface.

5. The display panel according to claim 3, wherein the first barrier is in contact with the second barrier, a surface of the first barrier in contact with the second barrier comprises at least one convex structure, a surface of the second barrier in contact with the first barrier comprises at least one concave structure, and the at least one concave structure and the at least one concave structure are engaged with each other.

6. The display panel according to claim 3, wherein in a direction parallel to a plane of the display panel, one of the plurality of color changing layers overlaps the first barrier and does not overlap the second barrier.

7. The display panel according to claim 6, wherein, an overlapping area between the color changing layer and the first barrier that overlap in the direction parallel to the plane of the display panel has a height of d1 in the thickness direction of the display panel, and the color changing layer has a height of d2 in the thickness direction of the display panel, where $d1 \geq 0.5*d2$.

8. The display panel according to claim 3, wherein in a direction parallel to a plane of the display panel, a width of the second barrier is greater than a width of the first barrier.

9. The display panel according to claim 3, wherein the first barrier comprises a first surface and a second surface that are opposed to each other in the thickness direction of the display panel, the second surface is closer to the second substrate than the first surface, and an area of the first surface is greater than or equal to an area of the second surface; and/or the second barrier comprises a third surface and a fourth surface that are opposed to each other in the thickness direction of the display panel, the third surface is closer to the first substrate than the fourth surface, and an area of the third surface is smaller than or equal to an area of the fourth surface.

10. The display panel according to claim 1, wherein the optical density of the first barrier is greater than the optical density of the second barrier; the reflectivity of the second barrier is greater than the reflectivity of the first barrier; and in the thickness direction of the display panel, a height of the second barrier is greater than or equal to a height of the first barrier, the second barrier at least partially wraps a the first barrier, and a distance between the first barrier and the second substrate is smaller than or equal to a distance between the first barrier and the first substrate.

11. The display panel according to claim 10, wherein the first barrier comprises a first surface and a second surface that are opposed to each other in the thickness direction of the display panel, the second surface is closer to the second substrate than the first surface, and an area of the first surface is greater than or equal to an area of the second surface; and/or the second barrier comprises a third surface and a fourth surface that are opposed to each other in the thickness direction of the display panel, the third surface is closer to the first substrate than the fourth surface, and an area of the third surface is smaller than or equal to an area of the fourth surface.

12. The display panel according to claim 1, wherein the first barrier is yellow, and the second barrier is gray.

13. The display panel according to claim 1, wherein an orthographic projection of the first barrier and the second barrier onto a plane of the first substrate at least partially surrounds one of the plurality of light-emitting units.

14. The display panel according to claim 1, wherein one of the plurality of light-emitting units comprises a blue micro light-emitting diode.

15. The display panel according to claim 1, wherein one of the plurality of color changing layers comprises a color resist and/or quantum dots, and when the color changing layer comprises both the color resist and the quantum dots, the color resist and the quantum dots are stacked, and the quantum dots are disposed at a side of the color resist close to the first substrate.

16. The display panel according to claim 1, wherein one of the plurality of color changing layers comprises quantum dots, the plurality of color changing layers comprises two color changing layers that have different emission colors from each other, and light-emitting units of the plurality of light-emitting units corresponding to the two color changing layers emit light of a same color;

the optical density of the first barrier is smaller than the optical density of the second barrier; and the reflectivity of the second barrier is smaller than the reflectivity of the first barrier.

17. A display device, comprising a display panel, wherein the display panel comprises:

a first substrate comprising a plurality of light-emitting units, a second substrate opposed to the first substrate and comprising a plurality of color changing layers having different colors, the plurality of color changing layers spaced from and in one-to-one correspondence with the plurality of light-emitting units; and a first barrier and second barrier arranged between the first substrate and the second substrate, wherein the first barrier overlaps the second barrier in a thickness direction of the display panel, an optical density of the first barrier is different from an optical density of the second barrier, and a reflectivity of the first barrier is different from a reflectivity of the second barrier, wherein the first barrier is arranged at a side of the second barrier close to the second substrate, and in a direction parallel to a plane of the display panel, one of the plurality of light-emitting units overlaps the second barrier, wherein the second barrier is spaced from the plurality of light-emitting units by an optically clear adhesive, and in the thickness direction of the display panel, a distance between an uppermost surface of the second barrier and the second substrate is smaller than a distance between an uppermost surface of the plurality of light-emitting units and the second substrate, a distance between a lowermost surface of the second barrier and the second substrate is smaller than a distance between a lowermost surface of the plurality of light-emitting units and the second substrate, and the distance between the lowermost surface of the second barrier and the second substrate is larger than the distance between the uppermost surface of the plurality of light-emitting units and the second substrate; and wherein the first barrier directly contacts the second barrier, and in the thickness direction of the display panel, a distance between a lowest surface of the first barrier and the first substrate is smaller than a distance between a lowermost surface of the plurality of color changing layers and the first substrate, a distance between a uppermost surface of the first barrier and the first substrate is smaller than a distance between an uppermost surface of the plurality of color changing layers and the first substrate, and the distance between the uppermost surface of the first barrier and the first substrate is larger than the distance between the lowermost surface of the plurality of color changing layers and the first substrate.

* * * * *